United States Patent
Kobayashi

(10) Patent No.: US 7,761,833 B2
(45) Date of Patent: Jul. 20, 2010

(54) SEMICONDUCTOR DEVICE AND DUMMY PATTERN ARRANGEMENT METHOD

(75) Inventor: Naohiro Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 143 days.

(21) Appl. No.: 12/103,028

(22) Filed: Apr. 15, 2008

(65) Prior Publication Data

US 2008/0251930 A1 Oct. 16, 2008

(30) Foreign Application Priority Data

Apr. 16, 2007 (JP) .............................. 2007-107328

(51) Int. Cl.
  *G06F 17/50* (2006.01)
(52) U.S. Cl. .......................................... 716/10; 716/14
(58) Field of Classification Search .................... 716/10, 716/14
  See application file for complete search history.

(56) References Cited

U.S. PATENT DOCUMENTS

| | | | | |
|---|---|---|---|---|
| 5,379,233 | A * | 1/1995 | Tripathi et al. ................... | 716/8 |
| 5,763,955 | A * | 6/1998 | Findley et al. ............... | 257/775 |
| 6,373,099 | B1 * | 4/2002 | Kikuchi et al. ............... | 257/331 |
| 6,615,399 | B2 * | 9/2003 | Yamauchi et al. ............... | 716/8 |
| 6,779,164 | B2 * | 8/2004 | Ohba et al. .................... | 716/11 |
| 6,782,512 | B2 * | 8/2004 | Asakawa ........................ | 716/1 |
| 7,200,831 | B2 * | 4/2007 | Kitabayashi .................. | 716/13 |
| 7,283,373 | B2 * | 10/2007 | Matsuhira .................... | 361/764 |
| 7,302,651 | B2 * | 11/2007 | Allen et al. ..................... | 716/3 |
| 7,665,055 | B2 * | 2/2010 | Kobayashi .................... | 716/10 |
| 2002/0184606 | A1 * | 12/2002 | Ohba et al. .................... | 716/11 |
| 2003/0177464 | A1 * | 9/2003 | Takechi et al. ................ | 716/10 |
| 2003/0204832 | A1 * | 10/2003 | Matumoto .................... | 716/19 |
| 2004/0083438 | A1 * | 4/2004 | Ohba et al. ..................... | 716/2 |
| 2004/0139412 | A1 * | 7/2004 | Ito et al. .......................... | 716/8 |
| 2005/0166176 | A1 * | 7/2005 | Watanabe et al. .............. | 716/21 |
| 2006/0036984 | A1 * | 2/2006 | Mukaihira ....................... | 716/5 |
| 2006/0168551 | A1 * | 7/2006 | Mukuno ........................ | 716/5 |
| 2008/0179754 | A1 * | 7/2008 | Hirabayashi ................ | 257/773 |
| 2008/0203562 | A1 * | 8/2008 | Araki et al. .................. | 257/734 |
| 2008/0209381 | A1 * | 8/2008 | Doong et al. .................. | 716/10 |

FOREIGN PATENT DOCUMENTS

| | | |
|---|---|---|
| JP | 2000-277615 | 10/2000 |
| JP | 2002-368088 | 12/2002 |
| JP | 2003-140319 | 5/2003 |
| JP | 2004-253655 | 9/2004 |

* cited by examiner

*Primary Examiner*—Stacy A Whitmore
(74) *Attorney, Agent, or Firm*—Young & Thompson

(57) ABSTRACT

A semiconductor device includes a plurality of wiring patterns arranged in a first wiring layer of the semiconductor device and extending in a first direction, and a plurality of dummy patterns arranged in the first wiring layer and extending in a second direction different from the first direction, wherein each of the plurality of dummy patterns is arranged spaced apart from each of the plurality of wiring patterns and includes one or more dummy lands formed by separating a part of the dummy pattern opposed to the wiring pattern, from the rest part of the dummy pattern.

12 Claims, 17 Drawing Sheets

SEMICONDUCTOR DEVICE AND DUMMY PATTERN ARRANGEMENT METHOD

BACKGROUND OF THE INVENTION

1. Field of the Invention

The present invention relates to a semiconductor device and dummy pattern arrangement method.

2. Description of Related Art

A semiconductor device has recently been developed to be more multi-layered. When a plurality of wiring layers are laminated in several layers, the wiring layer in an upper layer is influenced by convex/concave in the surface of the wiring layer in a lower layer. If this influence is large, there is a possibility that disconnection is occurred in wirings in the wiring layer formed in the upper layer in some cases. Even in the same wiring layer, the wirings may be disconnected due to partial convex/concave. In order to solve the problem, there is proposed a technique for arranging dummy patterns for each of the plurality of wiring layers in a region where the wiring patterns are not formed (see Japanese Unexamined Patent Application Publication No. 2002-368088, Japanese Unexamined Patent Application Publication No. 2000-277615, Japanese Unexamined Patent Application Publication No. 2003-140319, and Japanese Unexamined Patent Application Publication No. 2004-253655).

For example, Japanese Unexamined Patent Application Publication No. 2002-368088 discloses a technique for simplifying capacity calculation of parasitic capacity added to the wiring patterns by making distance between the dummy patterns and the wiring patterns constant. Further, Japanese Unexamined Patent Application Publication No. 2000-277615 discloses a technique arranging the dummy patterns having different densities in a region where the wiring patterns of the wiring region are not arranged.

By the way, manufacturing process has recently become more and more miniaturized and the distance between wirings has become shorter due to the miniaturization. Therefore, the distance between the dummy pattern and the wiring pattern has been decreased. When the distance between the dummy pattern and the wiring pattern is decreased, a resist may lie during a manufacturing process and the wiring pattern and the dummy pattern may be connected (shorted out) by dust (defect).

Normally, potential of each of the dummy patterns is set to a floating state (a state where no connection is made). Therefore, even when the wiring pattern and the dummy pattern are connected by dust as described above, a behavior of the semiconductor device is not immediately damaged. However, when the wiring pattern and the dummy pattern are connected by dust, unintentional wiring capacity and resistance are added to the wiring pattern. When the unintentional wiring capacity and resistance are added to the wiring pattern, unintentional propagation delay of the signal may be caused. The unintentional propagation delay of the signal not always cause malfunction of the semiconductor device. However, malfunction of the semiconductor device may be caused in some cases. Note that the function of the semiconductor device may be immediately damaged when the wiring pattern and the dummy pattern are connected by dust in a state where the dummy pattern is connected to power supply potential (VDD, GND).

Japanese Unexamined Patent Application Publication No. 2002-368088 discloses a layout where dummy patterns are arranged continuously in the direction perpendicular to the wiring patterns extending in one direction. Although the dummy patterns are arranged separately from the wiring patterns, if one end of the dummy pattern and the wiring pattern are shorted out by dust, the capacity of the dummy pattern is added to the wiring pattern.

On the other hand, in Japanese Unexamined Patent Application Publication No. 2000-277615, there is disclosed a technique arranging dummy patterns having different densities. In this case, the dummy patterns having low metal densities are arranged close to the wiring patterns and therefore it is suppressed that the wiring capacity is added to the wiring pattern by dust. However, when the technique disclosed in Japanese Unexamined Patent Application Publication No. 2000-277615 is applied, data amount required to execute dummy pattern arrangement process is increased.

In Japanese Unexamined Patent Application Publication No. 2000-277615, arrangement region of the pattern is divided into a plurality of blocks, and pattern having high metal density and pattern having low metal density are arranged in each block. The arrangement position of each pattern is identified using apex information (apex coordinate or the like) of each pattern included in the wiring data (layout data) Therefore, the technique for dividing the wiring region into the plurality of blocks as in Japanese Unexamined Patent Application Publication No. 2000-277615 requires setting the apex information of the pattern for each block after being divided, which increases data amount required for dummy pattern arrangement.

For example, when the wiring region of the semiconductor chip of 10 mm*10 mm is divided into blocks of 0.2 μm*0.2 μm, the number of blocks that is set reaches $2.5*10^9$. When the dummy patterns are arranged in all the blocks, the apex information of the dummy patterns corresponding to the number of blocks that are set is needed and data amount required for dummy pattern arrangement is increased. The increase in the data amount required for dummy pattern arrangement causes longer time for wiring process and memory shortage of the wiring device.

As stated above, an arrangement method for preventing the decrease of the reliability of the semiconductor device due to the attachment of dust between the patterns without increasing data amount for dummy pattern arrangement is required. A semiconductor device having a dummy pattern arrangement layout for preventing the decrease of the reliability of the semiconductor device due to the dust attachment between the patterns is also required.

SUMMARY

According to one aspect of the present invention, there is provided A semiconductor device includes a plurality of wiring patterns arranged in a first wiring layer of the semiconductor device and extending in a first direction, and a plurality of dummy patterns arranged in the first wiring layer and extending in a second direction different from the first direction, wherein each of the plurality of dummy patterns is arranged spaced apart from each of the plurality of wiring patterns and includes one or more dummy lands formed by separating a part of the dummy pattern opposed to the wiring pattern, from the rest part of the dummy pattern.

According to one aspect of the present invention, it is possible to prevent reliability of the semiconductor device from being decreased along with attachment of dust between the patterns.

According to another aspect of the present invention, there is provided a dummy pattern arrangement method using a computer includes reading arrangement data where first and second wiring patterns are arranged in a first region, the first and second wiring patterns extending along a first axis line, arranging one or more dummy patterns in the first region in such a manner that the dummy pattern extends along a second axis line different from the first axis line and is separated from the first and second wiring patterns, and processing a first end of the dummy pattern to form a first dummy land at the first wiring pattern side.

According to another aspect of the present invention, it is possible to prevent reliability of the semiconductor device from being decreased along with attachment of dust between the patterns without increasing data amount required for dummy pattern arrangement.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
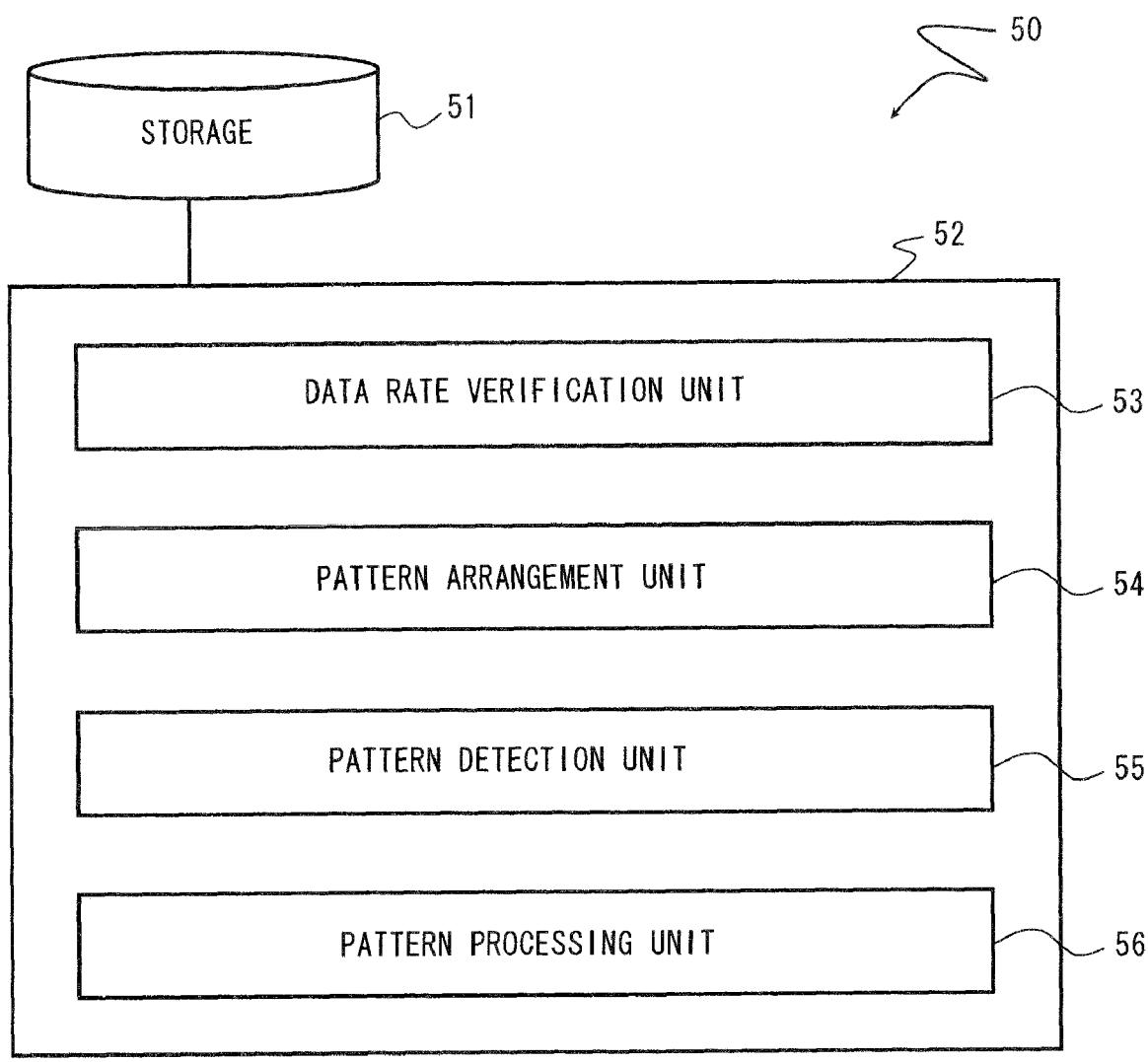
FIG. 1 is a schematic diagram showing a configuration of a dummy pattern arrangement device according to a first embodiment.
Figure 2:
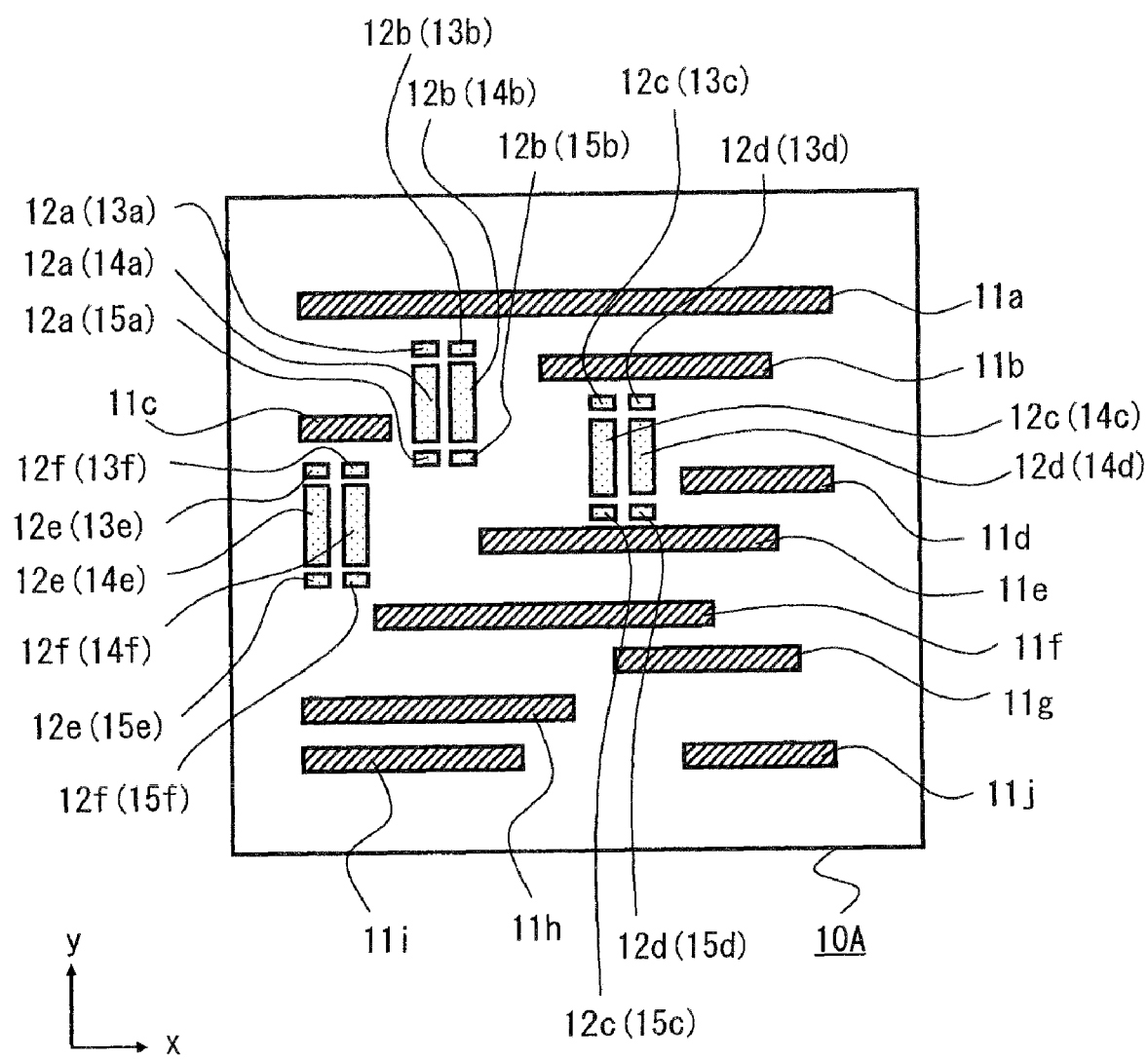
FIG. 2 is a configuration diagram of a wiring region 10A according to the first embodiment.
Figure 3:
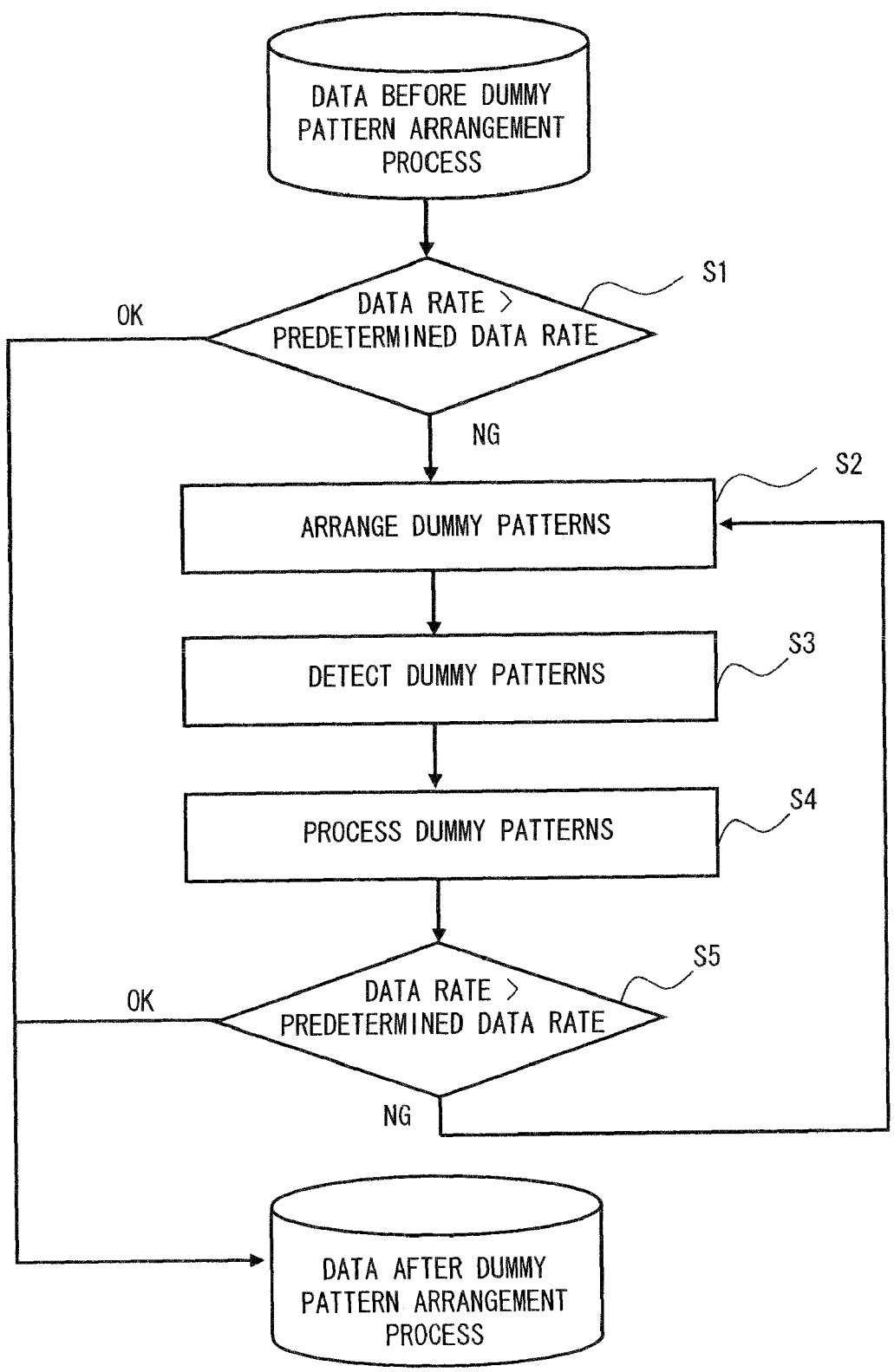
FIG. 3 is a flow chart showing a dummy pattern arrangement process according to the first embodiment.
Figure 4A:
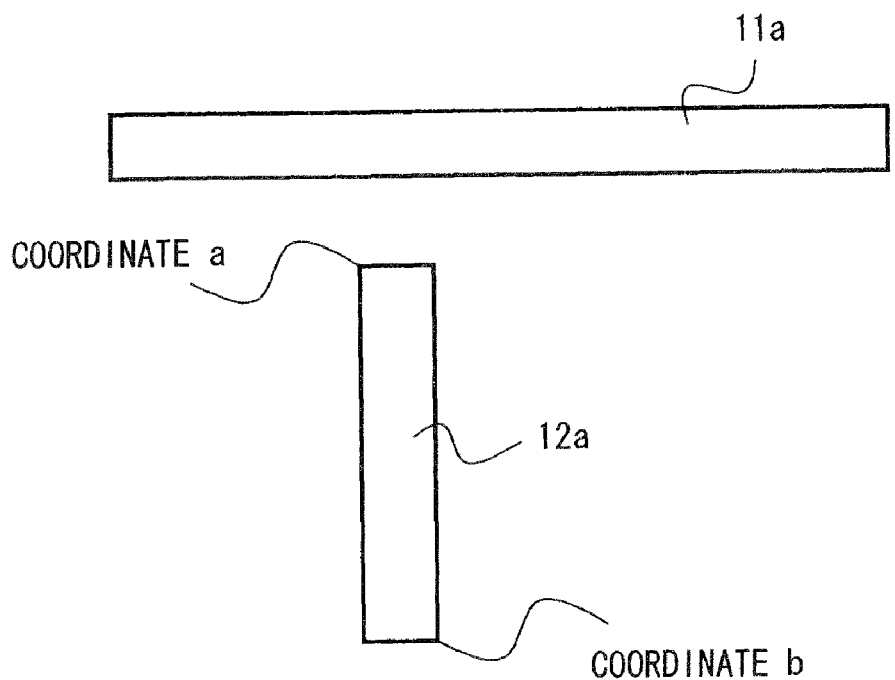
FIGS. 4A and 4B are explanation diagrams explaining processing of the dummy patterns.
Figure 4B:
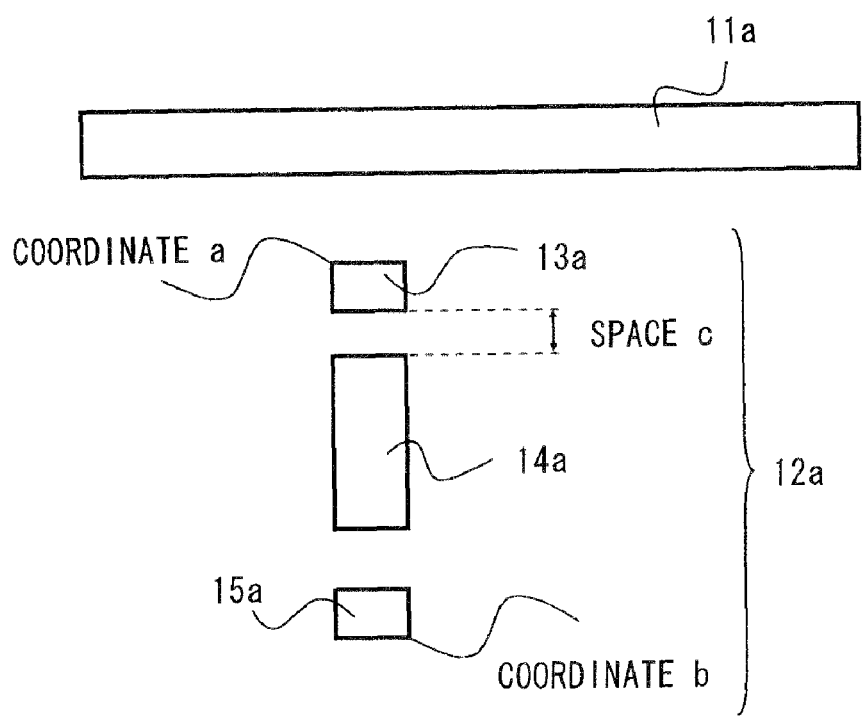

The first embodiment will be described with reference to FIGS. 1 to 4B. FIG. 1 shows a block diagram showing a schematic configuration of a dummy pattern arrangement device. FIG. 2 shows a wiring region (first region) 10A after dummy pattern arrangement process. FIG. 3 shows a flow of the dummy pattern arrangement process. FIGS. 4A and 4B show explanation diagrams showing states before and after pattern processing. Note that the process for dummy pattern arrangement is executed by a computer.

FIG. 1 shows a block diagram showing a schematic configuration of a dummy pattern arrangement device 50. As shown in FIG. 1, the dummy pattern arrangement device 50 includes a storage 51 and a processing unit 52. The storage 51 stores information of arrangement data, wiring rule or the like. The processing unit 52 reads out the information stored in the storage 51 and executes the dummy pattern arrangement process described in FIG. 3.

The processing unit 52 includes a data rate verification unit 53, a pattern arrangement unit 54, a pattern detection unit 55, and a pattern processing unit 56. The data rate verification unit 53 calculates the data rate of patterns arranged in a wiring region. The pattern arrangement unit 54 arranges the patterns in the wiring region. The pattern detection unit 55 searches and detects the patterns arranged in the wiring region. The pattern processing unit 56 processes the patterns detected by the pattern detection unit 55. Note that functions of the data rate verification unit 53, the pattern arrangement unit 54, the pattern detection unit 55, and the pattern processing unit 56 are realized by sequentially executing orders of programs in a processing unit. Note that the program itself may be stored either in the storage 51 or other storage devices (memory or the like).

FIG. 2 shows a wiring region (first region) 10A after the dummy pattern arrangement process. As shown in FIG. 2, the wiring region 10A is a two-dimensional planar region. A plurality of wiring patterns 11a to 11j and a plurality of dummy patterns 12a to 12f are arranged in the wiring region 10A. Note that the plurality of dummy patterns 12a to 12f are arranged in the wiring region 10A after the plurality of wiring patterns 11a to 11j are arranged. The dummy patterns 12a to 12f are arranged according to a wiring rule (wiring width, wiring interval or the like) same to that of the wiring patterns 11a to 11j.

The wiring patterns 11a to 11j extend along x axis (first axis line) and are rectangular patterns. Longitudinal direction of the wiring patterns 11a to 11j is x axis. On the other hand, the dummy patterns 12a to 12f extend along y axis (second axis line). The dummy patterns 12a to 12f are formed by three dummy lands. The dummy lands forming each of the dummy patterns 12a to 12f are formed by separating both ends (both end parts) of the rectangular dummy patterns having longitudinal direction of y axis. Note that the dummy land means the pattern that is left after the dummy pattern is partially removed.

The x axis and the y axis are perpendicular to each other. Therefore, the extending direction of the wiring patterns 11a to 11j and the extending direction of the dummy patterns 12a to 12f are perpendicular to each other. The pattern detection unit 55 of the processing unit 52 can identify each of the dummy patterns and the wiring patterns based on a difference in extending direction of the pattern.

As shown in FIG. 2, each of the dummy patterns 12a to 12f are arranged between the wiring patterns that are adjacent with each other. The dummy patterns 12a to 12f are arranged separately from the adjacent wiring patterns.

More specifically, the dummy pattern 12a is arranged between the wiring pattern 11a and the wiring pattern 11f and separately from the wiring pattern 11a and the wiring pattern 11f. The dummy pattern 12b is arranged in a same way as the dummy pattern 12a.

The dummy pattern 12c is arranged between the wiring pattern 11b and the wiring pattern 11e and separately from the wiring pattern 11b and the wiring pattern 11e. The dummy pattern 12d is arranged in a same way as the dummy pattern 12c.

The dummy pattern 12e is arranged between the wiring pattern 11c and the wiring pattern 11h and separately from the wiring pattern 11c and the wiring pattern 11h. The dummy pattern 12f is arranged in a same way as the dummy pattern 12e. The dummy patterns 12a to 12f are arranged in the wiring region 10A by the pattern arrangement unit 54 of the processing unit 52.

In the present embodiment, as stated above, the dummy patterns 12a to 12f extend along y axis perpendicular to x axis (extending direction of the wiring patterns 11a to 11j). When the dummy patterns are arranged extending along the direction perpendicular to the extending direction of the wiring patterns as in the present embodiment, attachment of dust can be a problem only on one ends of the dummy patterns. On the other hand, when the dummy patterns extend in the same direction to that of the wiring patterns, attachment of dust can be a problem in a region from one ends to the other ends of the dummy patterns. In the present embodiment, the dummy patterns 12a to 12f are arranged along y axis perpendicular to x axis (first axis line) where the wiring patterns 11a to 11j extend. Therefore, it is possible to lower chances to add the wiring capacity of the dummy pattern to the wiring pattern by dust attached therebetween.

In the present embodiment, the dummy patterns 12a to 12f are formed by three dummy lands. Each of the dummy patterns 12a to 12f is formed by separating both ends of the rectangular patterns having longitudinal direction of y axis. Since both ends of the rectangular patterns are separated, the dummy patterns 12a to 12f are formed of dummy lands 14a to 14f forming main parts of the patterns, dummy lands 13a to 13f forming one ends of the patterns (one end parts (first ends)), and dummy lands 15a to 15f forming the other ends of the patterns (the other end parts (second ends)). The width along y axis of each of the dummy lands 13a to 13f forming one ends of the patterns is substantially equal to the width along y axis of each of the dummy lands 15a to 15f forming the other ends of the patterns. The width along the y axis of each of the dummy lands 14a to 14f forming the main parts of the patterns is wider than the width along the y axis of each of the dummy lands forming end parts of the pattern above.

Each dummy pattern is formed by three dummy lands as follows. The dummy pattern 12a is formed by the dummy land 13a in the wiring pattern 11a side, the dummy land 15a in the wiring pattern 11f side, and the dummy land 14a between the dummy land 13a and the dummy land 15a. The dummy pattern 12b is formed by the dummy land 13b in the wiring pattern 11a side, the dummy land 15b in the wiring pattern 11f side, and the dummy land 14b between the dummy land 13b and the dummy land 15b. The dummy pattern 12c is formed by the dummy land 13c in the wiring pattern 11b side, the dummy land 15c in the wiring pattern 11e side, and the dummy land 14c between the dummy land 13c and the dummy land 15c. The dummy pattern 12d is formed by the dummy land 13d in the wiring pattern 11b side, the dummy land 15d in the wiring pattern 11e side, and the dummy land 14d between the dummy land 13d and the dummy land 15d. The dummy pattern 12e is formed by the dummy land 13e in the wiring pattern 11c side, the dummy land 15e in the wiring pattern 11h side, and the dummy land 14e between the dummy land 13e and the dummy land 15e. The dummy pattern 12f is formed by the dummy land 13f in the wiring pattern 11c side, the dummy land 15f in the wiring pattern 11h side, and the dummy land 14f between the dummy land 13f and the dummy land 15f.

Even when dust is attached between the wiring pattern 11a and the dummy patterns 12a and 12b, the value of the wiring capacity added to the wiring pattern 11a can be made minimum since the dummy lands 13a and 13b are arranged in the wiring pattern 11a side. Therefore, it is possible to make the wiring capacity of the dummy patterns added to the wiring pattern 11a partial (the dummy land 13a forming the dummy pattern 12a and the dummy land 13b forming the dummy pattern 12b). In other words, it is possible to prevent the wiring capacity of whole pattern before the dummy land 13a or the dummy land 13b is formed from being added to the wiring pattern 11a. It can also be said that it is possible to prevent the dummy land 14a or the dummy land 14b having wider width along y axis from being directly connected to the wiring pattern 11a by the dummy land 13a or the dummy land 13b having narrower width along y axis.

Similarly, even when dust is attached between the wiring pattern 11b and the dummy patterns 12c and 12d, the value of the wiring capacity added to the wiring pattern 11b can be made minimum since the dummy lands 13c and 13d are arranged in the wiring pattern 11b side. This explanation can be applied to the other end sides of the dummy patterns 12c and 12d. Similarly, even when dust is attached between the wiring pattern 11c and the dummy patterns 12e and 12f, the value of the wiring capacity added to the wiring pattern 11c can be made minimum by the dummy lands 13e and 13f arranged in the wiring pattern 11c side.

Note that the dummy lands forming the main parts of the patterns are formed wider in y axis direction than the dummy lands forming the ends of the patterns as will be clear from the drawing.

As stated above, in the present embodiment, the dummy patterns extending in the direction perpendicular to the extending direction of the wiring patterns are arranged in the wiring region. Therefore, it is possible to lower chances to connect the wiring pattern with the dummy pattern by dust. Further, the dummy lands forming the dummy patterns are arranged in the wiring pattern side. Therefore, even when dust is attached between the wiring pattern and the dummy pattern, the value of the wiring capacity added unintentionally to the wiring pattern can be made small. As a result, reliability of the behavior of the semiconductor device including such a wiring layer can be improved.

Note that the dummy patterns may be in floating state or may be fixed to power supply potential or ground potential.

Now, a process of arranging the dummy patterns 12a to 12f in the wiring region 10A by the dummy pattern arrangement device 50 will be described with reference to the flow chart in FIG. 3.

First, the processing unit 52 of the dummy pattern arrangement device 50 reads out data where the wiring patterns 11a to 11j are arranged in the wiring region 10A (arrangement data) from the storage 51 as the data before the dummy pattern arrangement process.

Then the data rate verification unit 53 of the dummy pattern arrangement device 50 checks whether the data rate of the arrangement data that is read in the wiring region 10A exceeds a predetermined data ratio (S1). Note that the data rate is equal to occupation rate of the patterns in the wiring region 10A. In this step, it is checked whether the occupation rate of the wiring patterns 11a to 11j in the wiring region 10A satisfies a predetermined occupation rate. When the checked data rate satisfies the predetermined data rate, the dummy pattern is not arranged in the wiring region 10A any more.

When the checked data rate does not satisfy the predetermined data rate, the pattern arrangement unit 54 of the dummy pattern arrangement device 50 arranges the dummy patterns in the wiring region 10A (S2). More specifically, the plurality of rectangular dummy patterns having longitudinal direction of y axis are arranged in the wiring region 10A where the wiring patterns 11a to 11j are not arranged. The region where the wiring patterns 11a to 11j are arranged can be determined based on attribute information (positional information of start points (one ends), positional information of endpoints (the other ends), and pattern width) of the wiring patterns 11a to 11j. The area where the wiring patterns 11a to 11j are not arranged is determined by determining the area where the wiring patterns 11a to 11j are arranged. Then the plurality of dummy patterns are arranged in the region where the determined wiring patterns 11a to 11j are not arranged. Note that the attribute information of the wiring patterns is stored in the storage 51 of the dummy pattern arrangement device 50. Note that the wiring rule of the dummy patterns that will be wired is the same to the wiring rule of the wiring patterns 11a to 11j. Arranging the dummy patterns corresponds to adding the attribute information of the dummy patterns to the arrangement data.

Then, the pattern detection unit 55 of the dummy pattern arrangement device 50 searches and detects the dummy patterns arranged in the wiring region 10A (S3). More specifically, the dummy patterns and the wiring patterns have different longitudinal directions as described above, therefore, based on this difference, the dummy patterns are distinguished from the wiring patterns. Note that the longitudinal direction of the patterns can be determined based on the attribute information of the patterns (positional information of the start points, positional information of end points, and pattern width).

In arranging the dummy patterns in the wiring region 10A, the pattern arrangement unit 54 can set new attributes specific to the dummy patterns and distinguish the wiring patterns from the dummy patterns based on these attributes.

Then, the pattern processing unit 56 of the dummy pattern arrangement device 50 processes both end parts of each of the plurality of detected dummy patterns (S4). The pattern processing unit 56 processes the dummy patterns so that the both end parts thereof are separated. The separated ends are identified based on the attribute information of the dummy patterns (positional information of start points (one ends), positional information of end points (the other ends)). The processing of the dummy patterns is executed based on minimum area and minimum wiring interval of the patterns that are predetermined as the wiring rule. Each of the dummy patterns arranged on the wiring region 10A becomes dummy patterns formed by the three dummy lands by the process of the pattern processing unit 56 (see FIG. 2). Note that the processing of the dummy patterns by the pattern processing unit 56 is realized by generating the attribute information of the dummy lands based on the attribute information of the dummy patterns.

Now, the process made by the pattern processing unit 56 will be described further with reference to FIGS. 4A and 4B. FIG. 4A shows an explanation diagram showing a state before the dummy pattern processing. FIG. 4B shows an explanation diagram showing a state after the dummy pattern processing.

As shown in FIG. 4A, the dummy pattern 12a is arranged in the wiring region 10A. One end of the dummy pattern 12a can be identified by coordinate a. The other end of the dummy pattern 12a can be identified by coordinate b.

FIG. 4B shows the dummy pattern 12a of FIG. 4A. As shown in FIG. 4B, the pattern processing unit 56 processes the dummy pattern 12a so that the dummy pattern 12a is formed by the three dummy lands (13a to 15a). More specifically, the pattern processing unit 56 identifies the end of the dummy pattern 12a based on the coordinate a. Then the pattern processing unit 56 processes the end of the dummy pattern 12a so that the area of the dummy land 13a accords with minimum area (predetermined area) of the pattern set in the predetermined wiring rule. Although the size of the dummy land 13a can be any, it is desirable to make the dummy land 13a small in order to prevent the wiring capacity from being increased. Therefore, the area of the dummy land 13a is set to be equal to the minimum area of the pattern set by the wiring rule.

Note that coordinate information of the end of the dummy land 13a in the dummy land 14a side and coordinate information of the end of the dummy land 14a in the dummy land 13a side are generated by the processing of coordinate a side of the dummy pattern 12a. The coordinate of the end of the dummy land 13a in the dummy land 14a side is identified based on the coordinate a and the minimum area. Similarly, the coordinate of the end of the dummy land 14a in the dummy land 13a side is identified based on the coordinate a, the minimum area, and space c. Therefore, generating the dummy land 13a in the dummy land 12a corresponds to generating information indicating the coordinate of the end of the dummy land 13a in the dummy land 14a side and the coordinate of the end of the dummy land 14a in the dummy land 13a side.

The above explanation can be applied to the process of the coordinate b side of the dummy pattern 12a. The overlapping explanation is omitted here.

Referring again to FIG. 3, after the S4, the data rate verification unit 53 of the dummy pattern arrangement device 50 checks whether the data rate in the wiring region 10A after the dummy pattern arrangement satisfies the predetermined data rate (S5). More specifically, it is checked whether the occupation rate of the wiring patterns and the dummy patterns in the wiring region 10A satisfies the predetermined occupation rate. When the checked data rate satisfies the predetermined data rate, the dummy patterns are not arranged in the wiring region 10A any more. When the checked data rate does not satisfy the predetermined data rate, the step goes back to S2 as above.

As stated above, in the present embodiment, the dummy patterns extending in the direction perpendicular to the extending direction of the wiring patterns are arranged in the wiring region. Therefore, it is possible to lower chances to connect the wiring pattern with the dummy pattern by dust. Further, the dummy lands forming the dummy patterns are arranged in the wiring pattern side. Therefore, even when dust is attached between the wiring pattern and the dummy pattern, the value of the wiring capacity added unintentionally to the wiring pattern can be made small. As a result, reliability of the semiconductor device including such a wiring layer can be improved. This embodiment does not arrange the dummy patterns having different sizes for each region. Therefore, data amount required in the dummy pattern arrangement process does not press the capacity of the storage 51 of the dummy pattern arrangement device 50.

Second Embodiment

Figure 5:
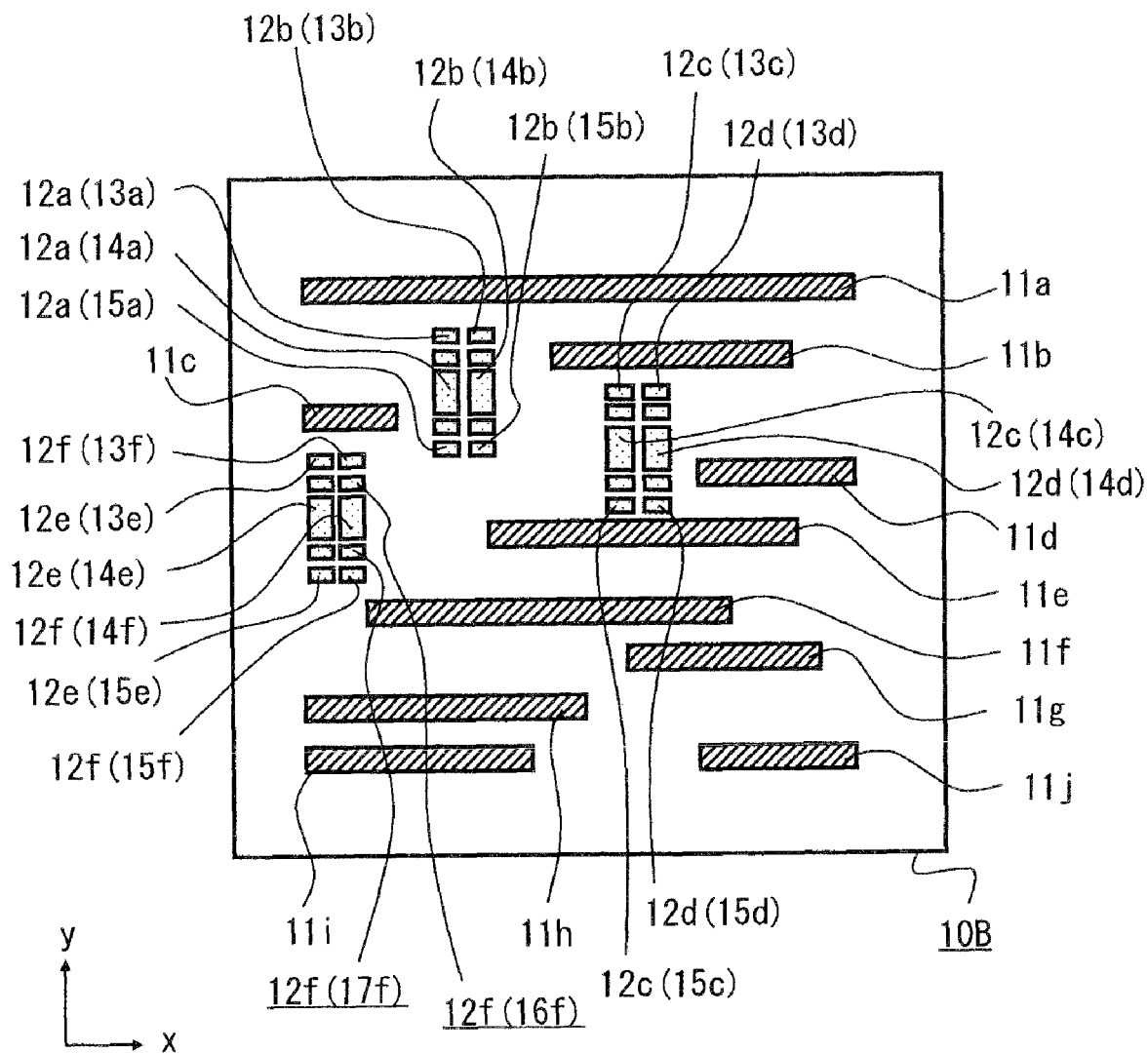
FIG. 5 is a configuration diagram of a wiring region 10B according to a second embodiment.
Figure 6:
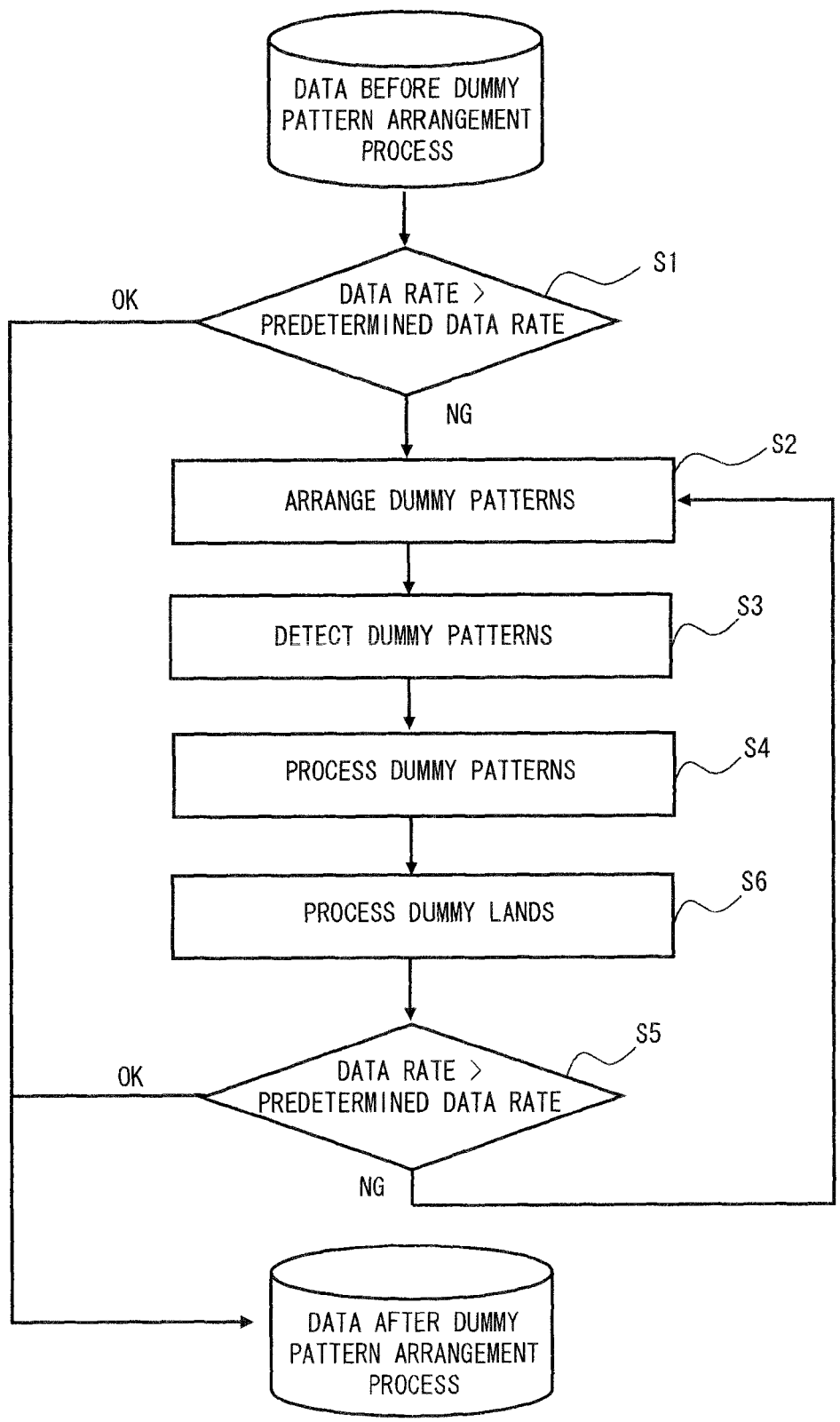
FIG. 6 is a flow chart showing a dummy pattern arrangement process according to the second embodiment.

The second embodiment will now be described with reference to FIGS. 5 and 6. FIG. 5 shows a wiring region 10B. FIG. 6 shows a flow of the dummy pattern arrangement process according to this embodiment.

The dummy patterns according to the present embodiment are formed by five dummy lands and two dummy lands are included in each of the both end parts. In other words, each of the dummy patterns according to the present embodiment includes two dummy lands forming one end part of the pattern and two dummy lands forming the other end part of the pattern in addition to the dummy land forming the main part of the pattern.

Note that the width along the y axis of each of the dummy lands forming the main parts of the patterns is wider than the width along the y axis of each of the dummy land forming the ends of the patterns. The width along the y axis of each of the dummy lands forming the ends of the patterns is equal to each other and equal to the width of each of the dummy lands forming the ends of the patterns in the first embodiment.

According to the above configuration, the dummy lands forming the main parts of the patterns are arranged in position spaced further apart from the wiring patterns compared with the first embodiment. Therefore, even when larger dust is attached between the wiring pattern and the dummy pattern, only the dummy land forming the end of the pattern closer to the wiring pattern is connected to the wiring pattern. The dummy land forming the main part of the pattern is not connected to the wiring pattern. Therefore, even when dust is attached between the wiring pattern and the dummy pattern, the value of the wiring capacity added unintentionally to the wiring pattern can be made smaller. The wiring capacity of the dummy pattern added to the wiring pattern can be made partial.

Hereinafter, the configuration of the dummy patterns according to the present embodiment will be described with focusing on the dummy pattern 12*f*.

As shown in FIG. 5, the dummy pattern 12*f* includes dummy lands 13*f* and 16*f* in the wiring pattern 11*c* side and dummy lands 15*f* and 17*f* in the wiring pattern 11*h* side. The dummy pattern 12*f* includes a dummy land 14*f* between the dummy lands 13*f* and 16*f* and the dummy lands 15*f* and 17*f*. In other words, the dummy pattern 12*f* includes five dummy lands of the dummy land 13*f*, the dummy land 16*f*, the dummy land 14*f*, the dummy land 17*f*, and the dummy land 15*f* from the wiring 11*c* side to the wiring 11*h* side. Note that the dummy land 14*f* has wider width along y axis than the width of each of the dummy lands 13*f*, 16*f*, 15*f*, and 17*f*.

Note that the dummy land 13*f* and the dummy land 15*f* are formed by separating both end parts of rectangular dummy pattern having longitudinal direction of y axis by the pattern processing unit 56. The dummy land 16*f* and the dummy land 17*f* are formed by separating both end parts of the dummy land 14*f* formed in forming the dummy land 13*f* and the dummy land 15*f* by the pattern processing unit 56. Note that the dummy land 16*f* can also be formed by separating one end part of the dummy land 13*f* that is formed in large shape. The same explanation can be applied to the dummy land 17*f*.

In the present embodiment, even when dust is attached between the dummy pattern 12*f* and the wiring pattern 11*c*, it is possible to prevent the dummy land 14*f* from being connected to the wiring pattern 11*c* by the dummy lands 13*f* and 16*f*. Therefore, even when larger dust is attached between the wiring pattern and the dummy pattern, the size of the wiring capacity of the dummy pattern added unintentionally to the wiring pattern can be made minimum.

Now, arrangement procedure of the dummy pattern according to the present embodiment will be described with reference to FIG. 6. The difference between the present embodiment and the first embodiment is to process the dummy lands in this embodiment (S6). More specifically, the both end parts of the dummy lands forming the main parts of the dummy patterns are separated. Since S1 to S3 overlap with the description in the first embodiment, the description is omitted. The description will be made here with focusing on the dummy pattern 12*f*.

The dummy land 14*f* forming the dummy pattern 12*f* (dummy land forming the main part of the pattern) is formed in S4. Then the pattern processing unit 56 processes both end parts of the dummy land 14*f* (S6), the dummy land 16*f* is arranged in the wiring pattern 11*c* side, and the dummy land 17*f* is arranged in the wiring pattern 11*h* side. Note that the processing of the dummy land 17*f* is executed similarly to the description regarding FIG. 4 as above. After S6, it is checked whether the data rate satisfies the predetermined data rate (S5) as in the first embodiment.

In the present embodiment, it is possible to make the value of the wiring capacity unintentionally added to the wiring pattern smaller even when larger dust is attached between the wiring pattern and the dummy pattern compared with the first embodiment.

Third Embodiment

Figure 7:
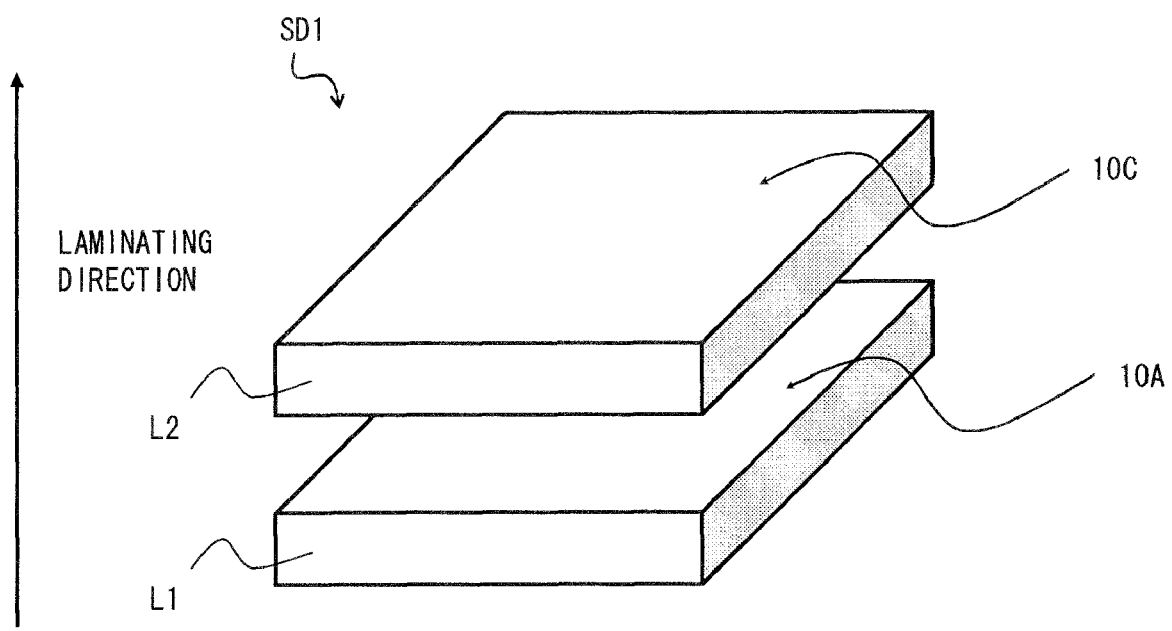
FIG. 7 is a schematic perspective diagram of a semiconductor device according to a third embodiment.
Figure 8:
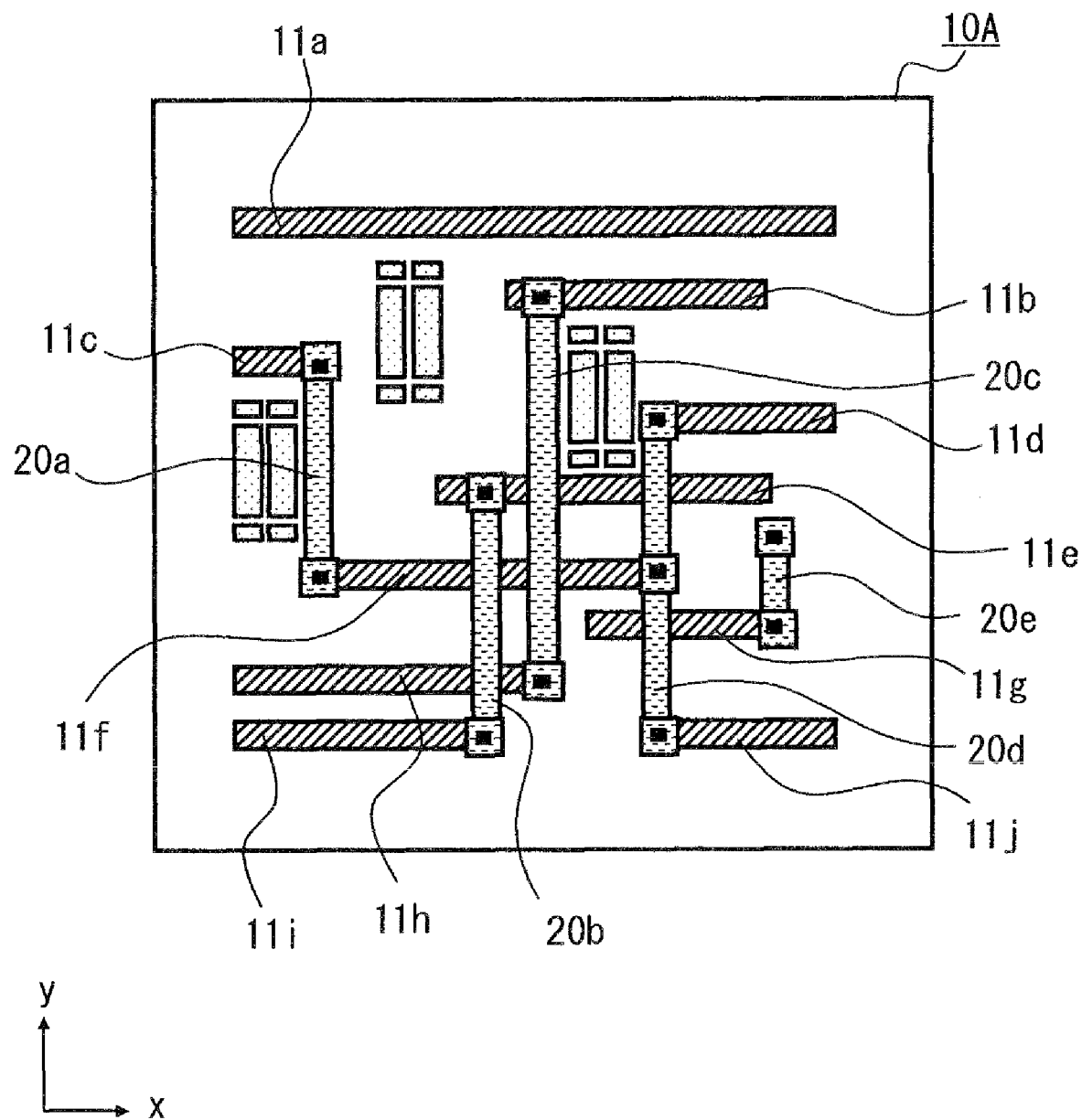
FIG. 8 is a configuration diagram where patterns of a wiring region 10C are superimposed on the wiring region 10A of the first embodiment.
Figure 9:
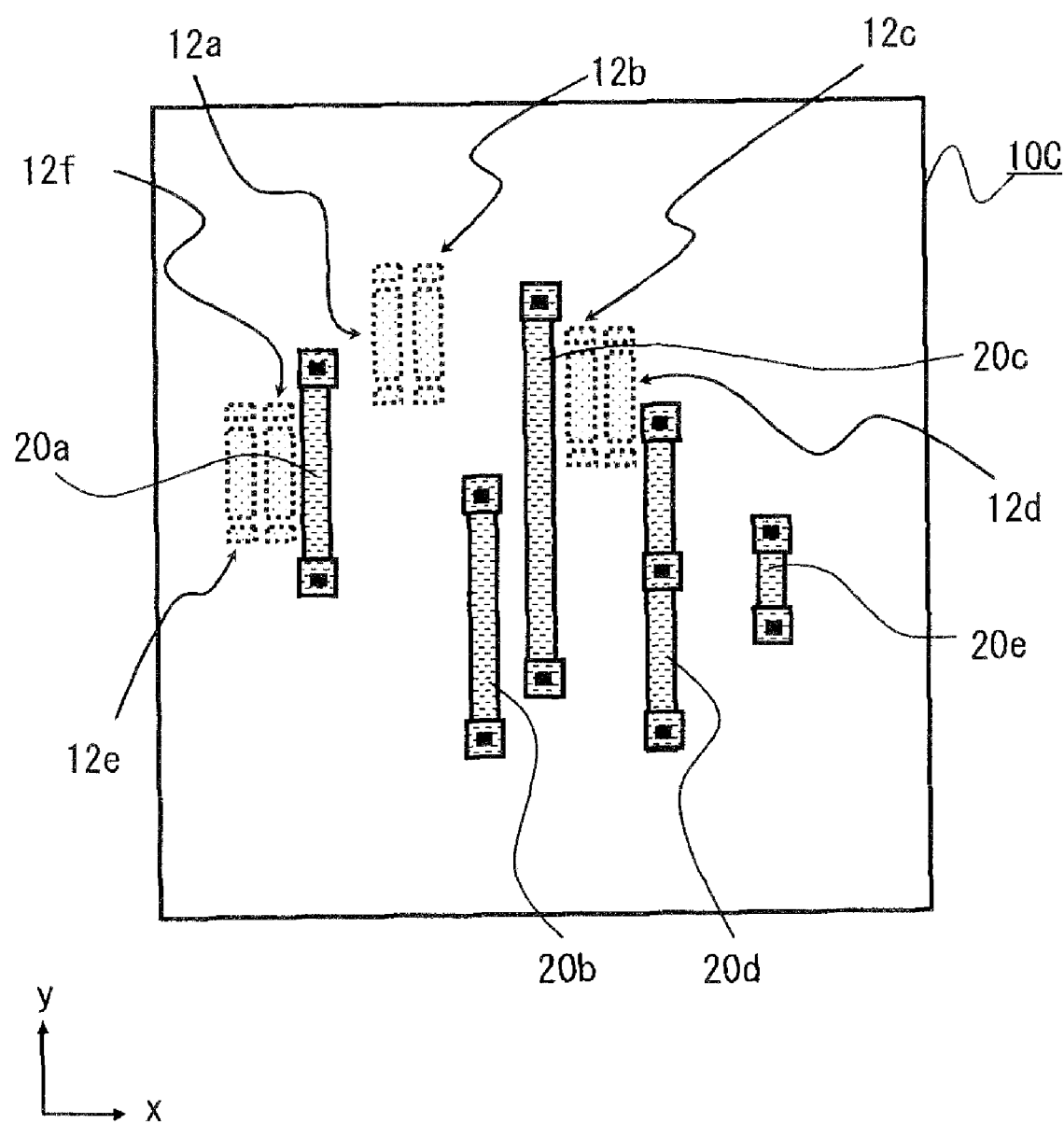
FIG. 9 is a configuration diagram showing patterns of the wiring region 10C.
Figure 10:
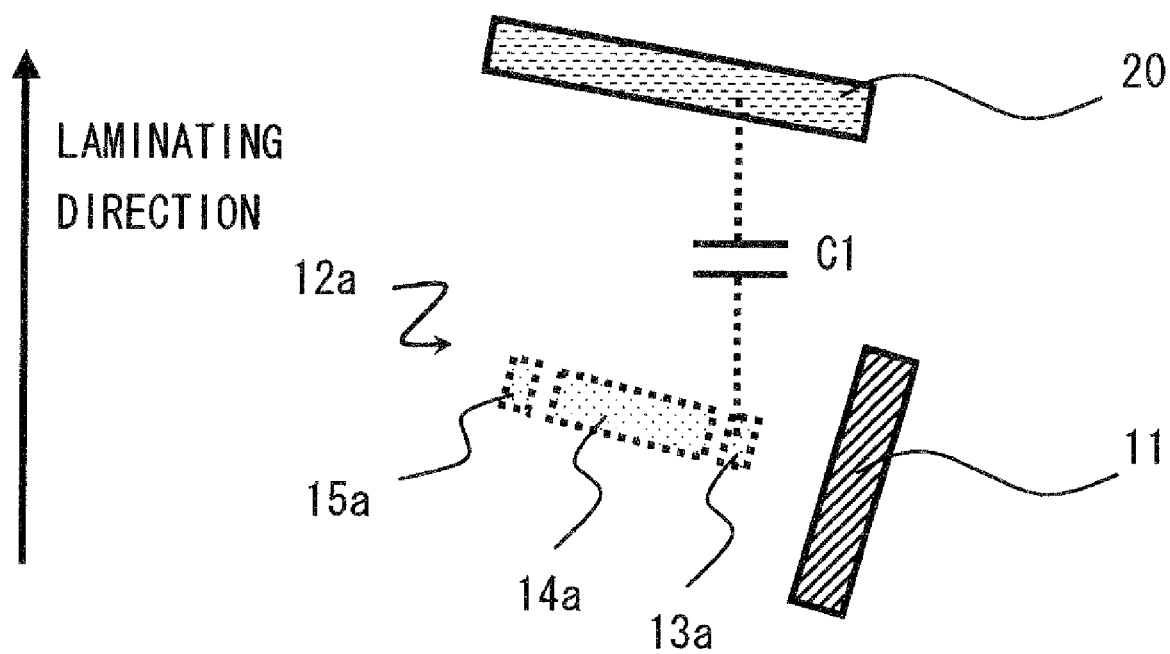
FIG. 10 is an explanation diagram of a parasitic capacity C1 formed in laminating direction.
Figure 11:
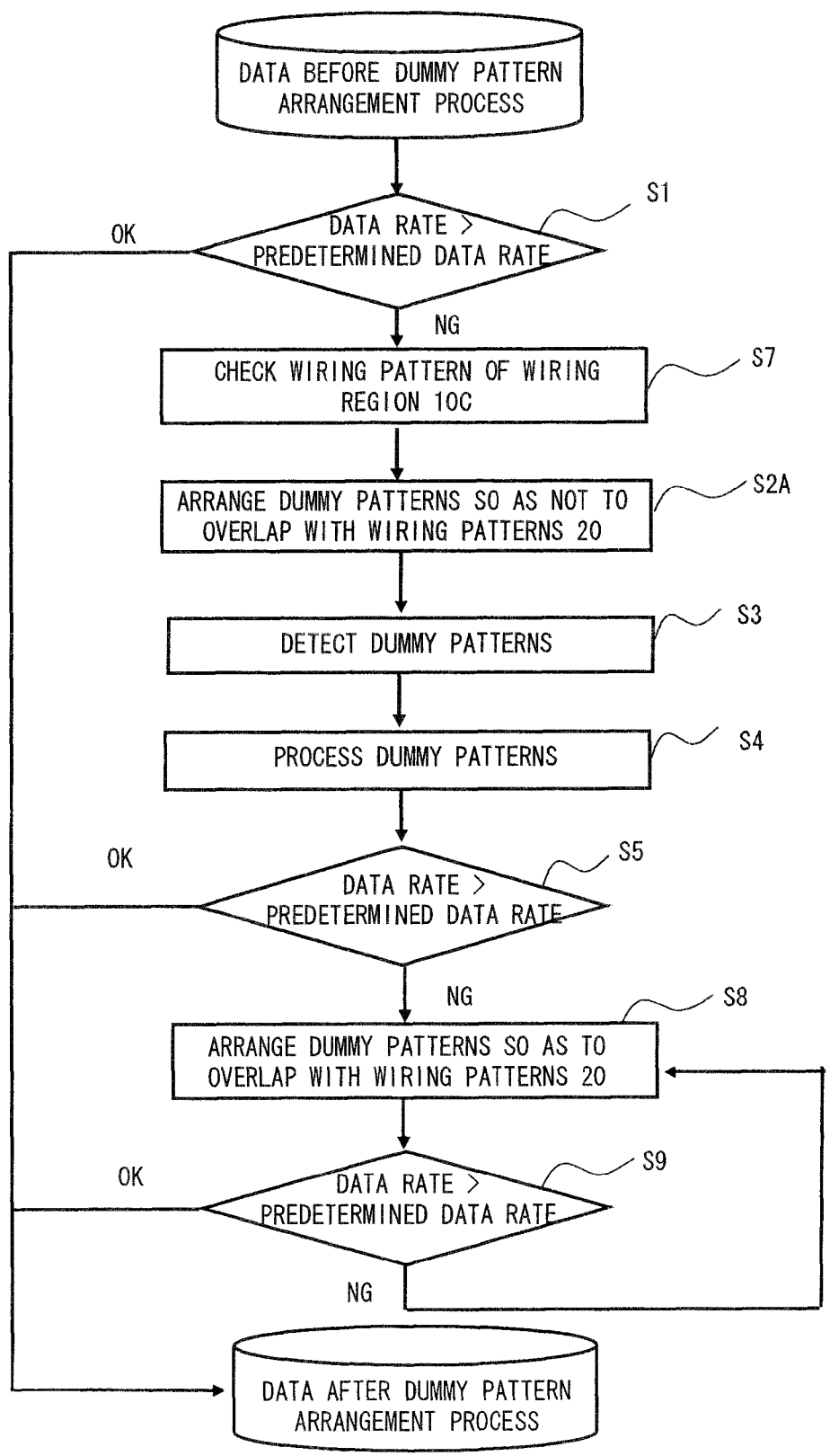
FIG. 11 is a flow chart showing a dummy pattern arrangement process according to a third embodiment.
Figure 12:
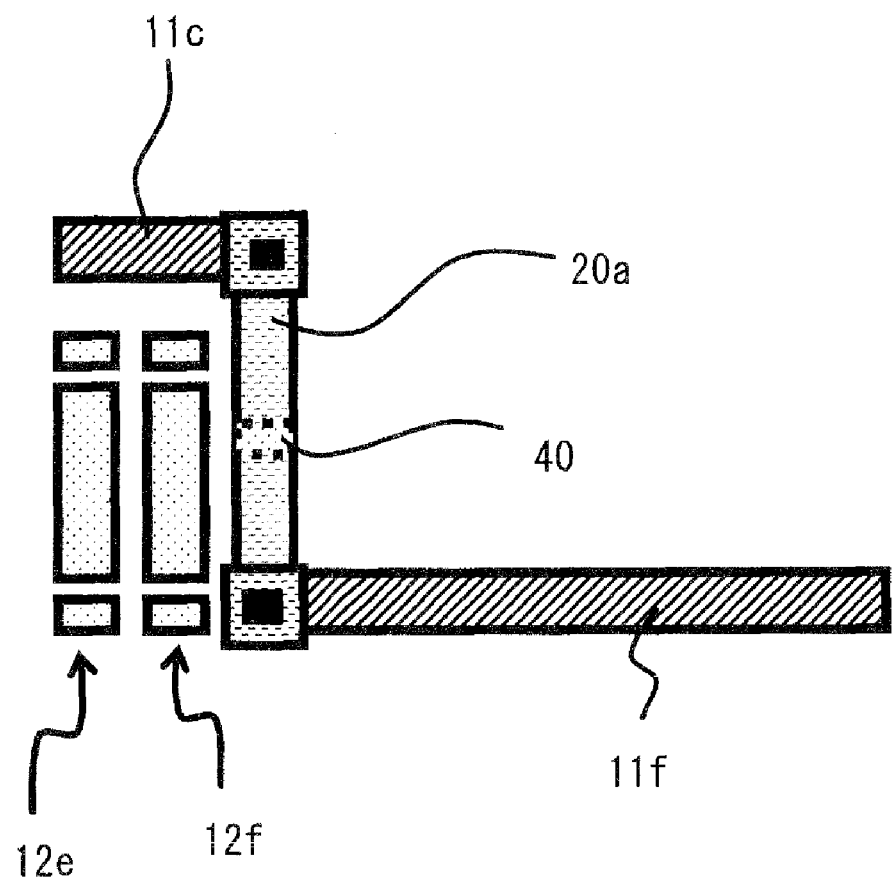
FIG. 12 is a partial configuration diagram of a wiring region.
Figure 12:
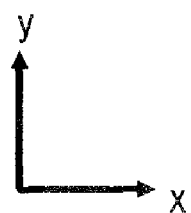

The third embodiment will be described with reference to FIGS. 7 to 12. FIG. 7 shows a schematic perspective view of a semiconductor device SD1 according to the present embodiment. FIG. 8 shows a configuration diagram where the patterns of the wiring region 10C are superimposed on the wiring region 10A (see first embodiment). FIG. 9 shows the patterns of the wiring region 10C. Note that the wiring region 10C is formed in the wiring layer of the upper layer of the wiring layer where the wiring region 10A is formed. FIG. 10 shows an explanation diagram of the capacity formed in laminating direction. FIG. 11 shows a flow of the dummy pattern arrangement process according to the third embodiment. FIG. 12 shows an explanation diagram of the pattern after S8 (see FIG. 11).

In the present embodiment, the dummy patterns are arranged in the wiring region 10A in consideration of the position of the wiring patterns arranged in the wiring region (second region) 10C of the wiring layer of the upper layer. Therefore, the value of the capacity added to the wiring pattern can be made smaller. Hereinafter, the description will be made more particularly.

As shown in FIG. 7, the semiconductor device SD1 includes a wiring layer (first wiring layer) L1 and a wiring layer (second wiring layer) L2. The semiconductor device SD1 is formed by laminating the wiring layer L1 and the wiring layer L2. Note that the wiring layer L1 and the wiring layer L2 are spaced apart with each other in FIG. 7 for the sake of convenience.

As shown in FIG. 7, the upper surface of the wiring layer L1 corresponds to the wiring region 10A according to the first embodiment. The upper surface of the wiring layer L2 corresponds to the wiring region 10C described below. The wiring layer L1 and the wiring layer L2 are laminated with each other so that the wiring region 10A and the wiring region 10C are superimposed with each other. Note that the wiring region 10A and the wiring region 10C are superimposed with each other with interlayer insulating film therebetween.

As shown in FIG. 8, the wiring region 10C corresponding to the upper surface of the wiring layer L2 is superimposed on the wiring region 10A corresponding to the upper surface of the wiring layer L1. The wiring patterns 20a to 20e are formed in the wiring region 10C. The wiring patterns 20a to 20e are the patterns extending along y axis and the rectangular patterns having longitudinal direction of y axis. Note that the extending direction of the wiring patterns 20a to 20e in the wiring region 10C and the extending direction of the wiring patterns 11a to 11j in the wiring region 10A are perpendicular to each other. Due to such a configuration, sum of the wiring length in the semiconductor device configured by multi-layered wiring layer can be made minimum.

Further, as shown in FIG. 8, the wiring pattern 20a of the wiring region 10C connects the wiring pattern 11c and the wiring pattern 11f of the wiring region 10A. The wiring pattern 20b connects the wiring pattern 11e and the wiring pattern 11i. The wiring pattern 20c connects the wiring pattern 11b and the wiring pattern 11h. The wiring pattern 20d connects the wiring pattern 11d and the wiring pattern 11f and the wiring pattern 11j. The wiring pattern 20e connects the wiring pattern 11g and other wiring pattern formed in the upper layer.

As shown in FIG. 9 (see also FIG. 8), the dummy patterns 12a to 12f arranged in the wiring region 10A are arranged in the wiring region 10A so as not to overlap with the wiring patterns 20a to 20e formed in the wiring region 10C. Therefore, the size of the parasitic capacity C1 in laminating direction formed between the dummy pattern 12 of the wiring region 10A and the wiring pattern 20 of the wiring region 10C can be minimized. In the pattern of the wiring region 10C shown in FIG. 9, the dummy patterns 12a to 12f of the wiring region 10A are shown in dotted lines.

Now, the parasitic capacity formed in the laminating direction will be described with reference to FIG. 10. As shown in FIG. 10, when the dummy pattern 12a of the wiring region 10A is formed immediately below the wiring pattern 20 of the wiring region 10C, the parasitic capacity is formed between the dummy pattern 12a and the wiring pattern 20 (parasitic capacity C1 is formed between the dummy land 13a and the wiring pattern 20). In this state, when the wiring pattern 11 and the dummy land 13a in the wiring region 10A are connected by dust, the parasitic capacity C1 formed between the dummy land 13a and the wiring pattern 20 is added to the wiring pattern 11 in addition to the wiring capacity of the dummy pattern 13a.

In the present embodiment, the dummy pattern 12a is arranged in the wiring region 10A so as not to overlap with the wiring pattern 20 in consideration of the wiring pattern 20 of the wiring region 10C of the upper layer as described above. Therefore, the value of the parasitic capacity formed between the dummy pattern 12a and the wiring pattern 20 can be made small (smaller than the parasitic capacity C1 formed when the dummy pattern 12a is arranged so as to overlap with the wiring pattern 20). Even when the wiring pattern 11 and the dummy land 13a in the wiring region 10A are connected by dust, the parasitic capacity of the laminating direction that is added to the wiring pattern 11 (parasitic capacity between the dummy land 13a and the wiring pattern 20) can be made small.

Note that the dummy pattern 12a includes a dummy land 13a having narrow width along y axis (dummy land forming the end part of the pattern) in the wiring pattern 11 side. Therefore, the wiring capacity added to the wiring pattern 11 by dust is small compared with the pattern where the end parts are not separated. Similarly, the parasitic capacity of the laminating direction formed between the dummy land 13a and the wiring pattern 20 is small as well. Even when the dummy land 13a and the wiring pattern 11 are connected by dust, the size of the capacity unintentionally added to the wiring pattern (sum of the wiring capacity of the dummy land 13a and the parasitic capacity formed between the dummy land 13a and the wiring pattern 20) is small.

Now, the method of arranging the dummy patterns 12a to 12f will be described with reference to the flow chart of FIG. 11.

S1 is the same to the description of the above embodiments.

In this embodiment, when the checked data rate does not satisfy the predetermined data rate, the processing unit 52 of the dummy pattern arrangement device 50 checks the arrangement information of the wiring patterns 20a to 20e of the wiring region 10C before the dummy patterns are arranged in the wiring region 10A (S7). More particularly, the arrangement position of the wiring patterns 20a to 20c in the wiring region 10C is checked based on the attribute information of the wiring patterns 20a to 20c of the wiring region 10C (positional information of start points (one ends), positional information of endpoints (the other ends), and pattern width). Then the pattern arrangement unit 54 of the dummy pattern arrangement device 50 arranges the dummy patterns in the wiring region 10A so as not to overlap with the wiring patterns 20a to 20e of the wiring region 10C (S2A). Note that S7 is executed by the pattern detection unit 55.

Then the pattern detection unit 55 of the dummy pattern arrangement device 50 detects the dummy patterns arranged in the wiring region 10A (S3). The pattern processing unit 56 of the dummy pattern arrangement device 50 processes the determined dummy patterns (S4). Then it is checked whether the data rate satisfies the predetermined data rate (S5). Note that S1, S3, and S4 are equal to S1, S3, and S4 in the first embodiment. It is possible to go back to S1 after S4.

In the present embodiment, when the data rate does not satisfy the predetermined data rate (S5) even by arranging the dummy patterns (S2A), the dummy pattern arrangement device 50 arranges the dummy pattern 40 (see FIG. 12) in the wiring region 10A so as to overlap with the wiring pattern 20 of the wiring region 10C (S8).

S8 will be described further with reference to FIG. 12. As shown in FIG. 12, in S8, the dummy pattern 40 is arranged in the wiring region 10A so as to overlap with the wiring pattern 20a formed in the wiring region 10C in order to increase the data rate.

It can be a problem that dust is attached between the dummy pattern 40 and the wiring patterns 11 by the arrangement of the dummy pattern 40. More specifically, when dust is attached between the wiring pattern 11C and the dummy pattern 40, the wiring capacity of the dummy pattern 40 is added to the wiring pattern 11c. In addition to this, the parasitic capacity between the dummy pattern 40 and the wiring pattern 20a is also added to the wiring pattern 11c.

In the present embodiment, the dummy pattern 40 is made small as shown in FIG. 12 in order to keep balance between satisfying the data rate and the problem of the wiring capacity. The width in y axis direction of the dummy pattern 40 is smaller than the width in y axis direction of the wiring pattern 20a. In other words, the pattern length of the dummy pattern 40 is shorter than the pattern length of the wiring pattern 20a. Therefore, even when the dummy pattern 40 is connected to the wiring pattern 11c or the wiring pattern 11f, the wiring capacity added to the wiring pattern 11c or the wiring pattern 11f can be made small. Note that a plurality of dummy patterns 40 can be arranged at one time in order to keep the data rate.

Further, in the present embodiment, the dummy pattern 40 is arranged in intermediate position between the wiring pattern 11c and the wiring pattern 11f. Therefore, the probability where the dummy pattern 40 is connected to the wiring pattern 11c or the wiring pattern 11f can be made lower. Note that the intermediate position between the wiring patterns mentioned here means substantially intermediate position and does not need to be intermediate in a strict sense.

After the S8, the data rate verification unit 53 checks whether the data rate of the wiring region 10A after the dummy pattern 40 is arranged satisfies the predetermined data rate (S9). When the data rate of the wiring region 10A satisfies the predetermined data rate, the dummy pattern arrangement process is completed. When the data rate of the wiring region 10A does not satisfy the predetermined data rate, the step goes back to S8 and the dummy pattern arrangement device 50 arranges the dummy pattern 40 to the wiring region 10A again.

In the present embodiment, the dummy patterns are arranged in the wiring region 10A in consideration of the position of the wiring patterns arranged in the wiring region 10C. Therefore, it is possible to make the value of the capacity unintentionally added to the wiring patterns smaller as stated above.

Fourth Embodiment

Figure 13:
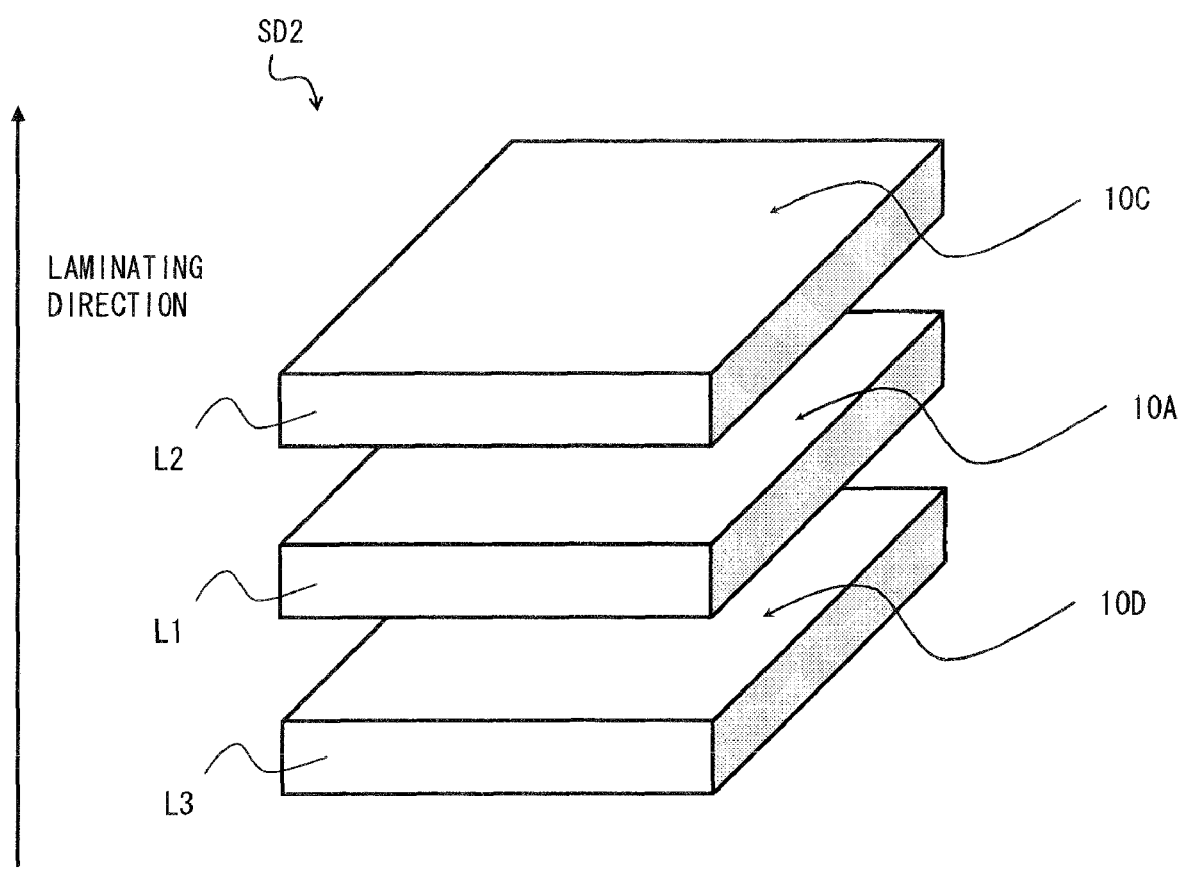
FIG. 13 is a schematic perspective diagram of a semiconductor device according to a fourth embodiment.
Figure 14:
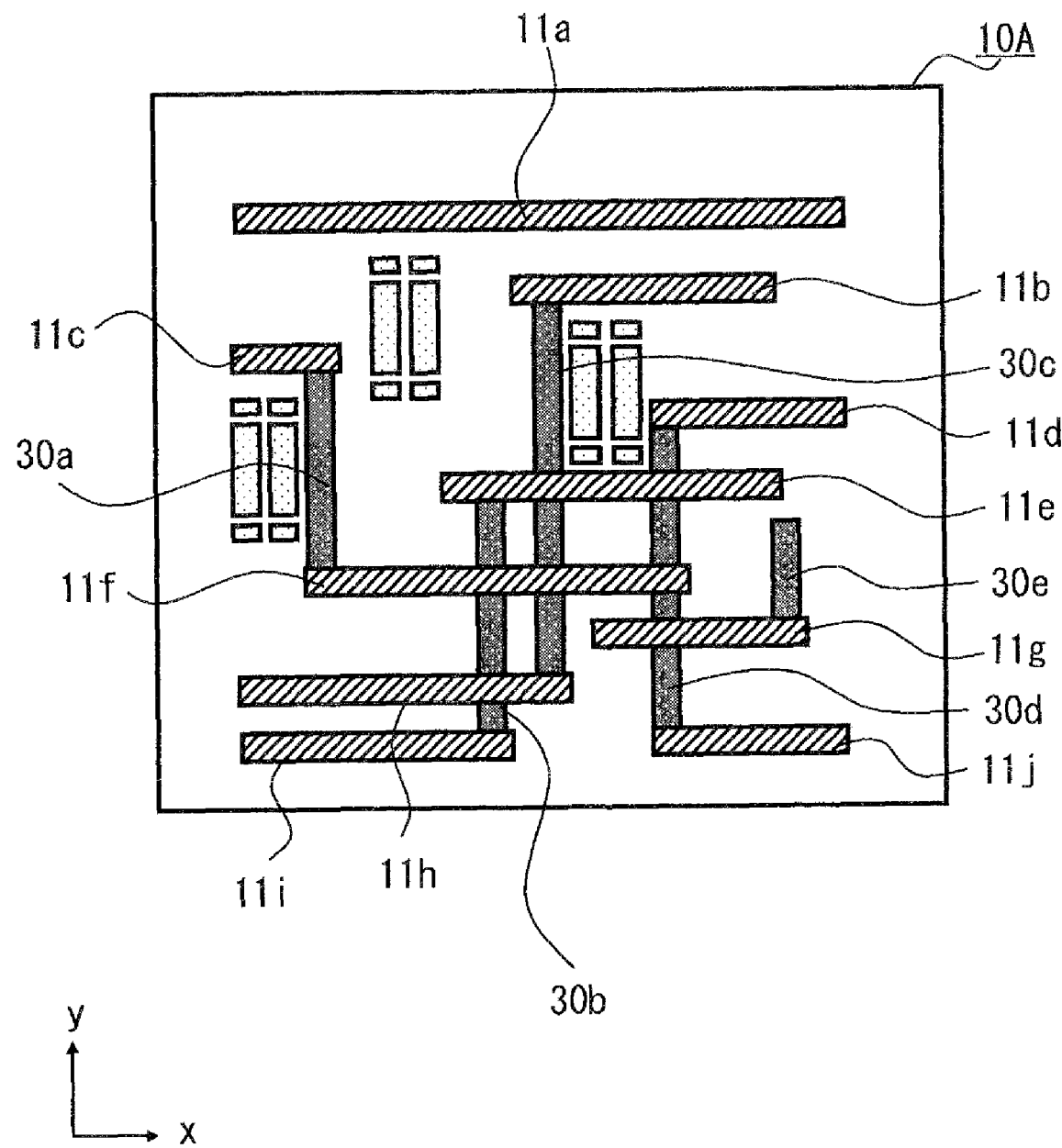
FIG. 14 is a configuration diagram of the wiring region 10A of the first embodiment superimposed on the patterns of a wiring region 10D.
Figure 15:
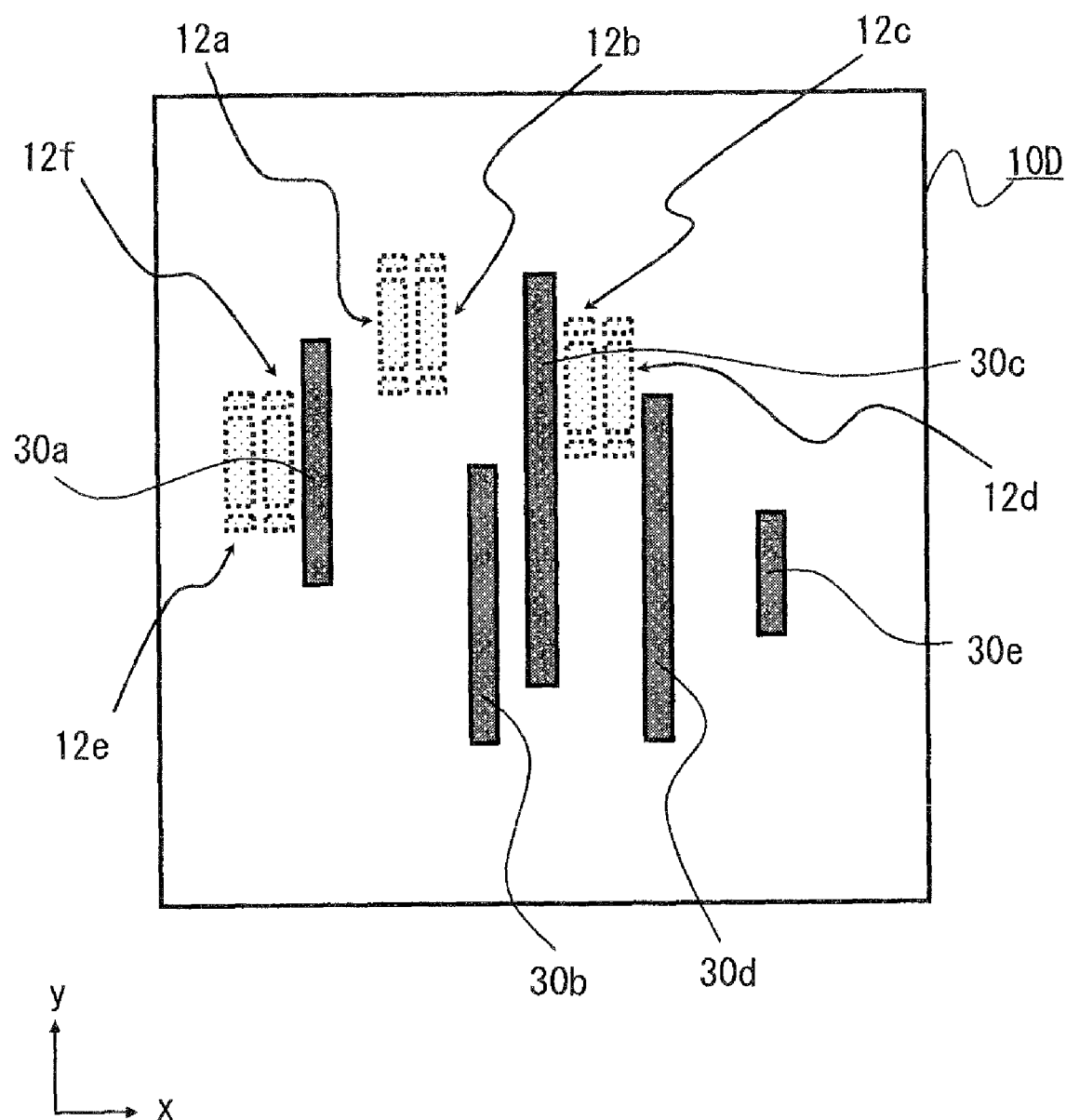
FIG. 15 is a configuration diagram showing patterns of the wiring region 10D.
Figure 16:
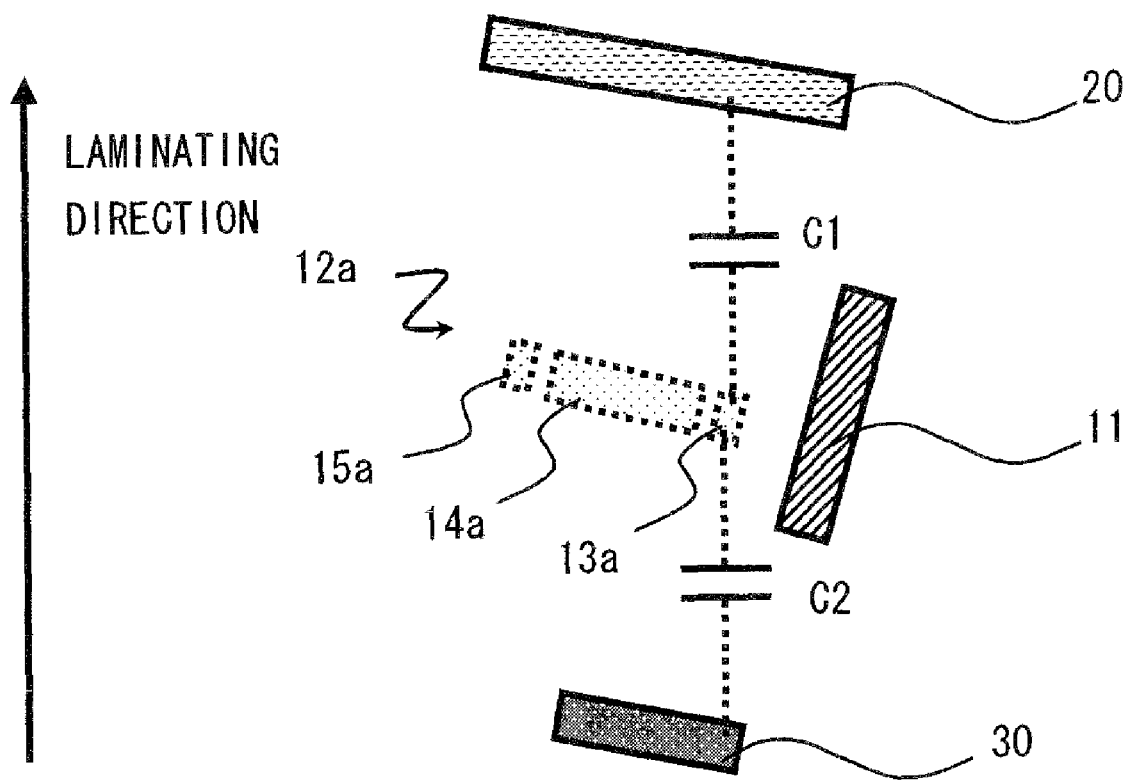
FIG. 16 is an explanation diagram of a parasitic capacity C2 formed in laminating direction.
Figure 17:
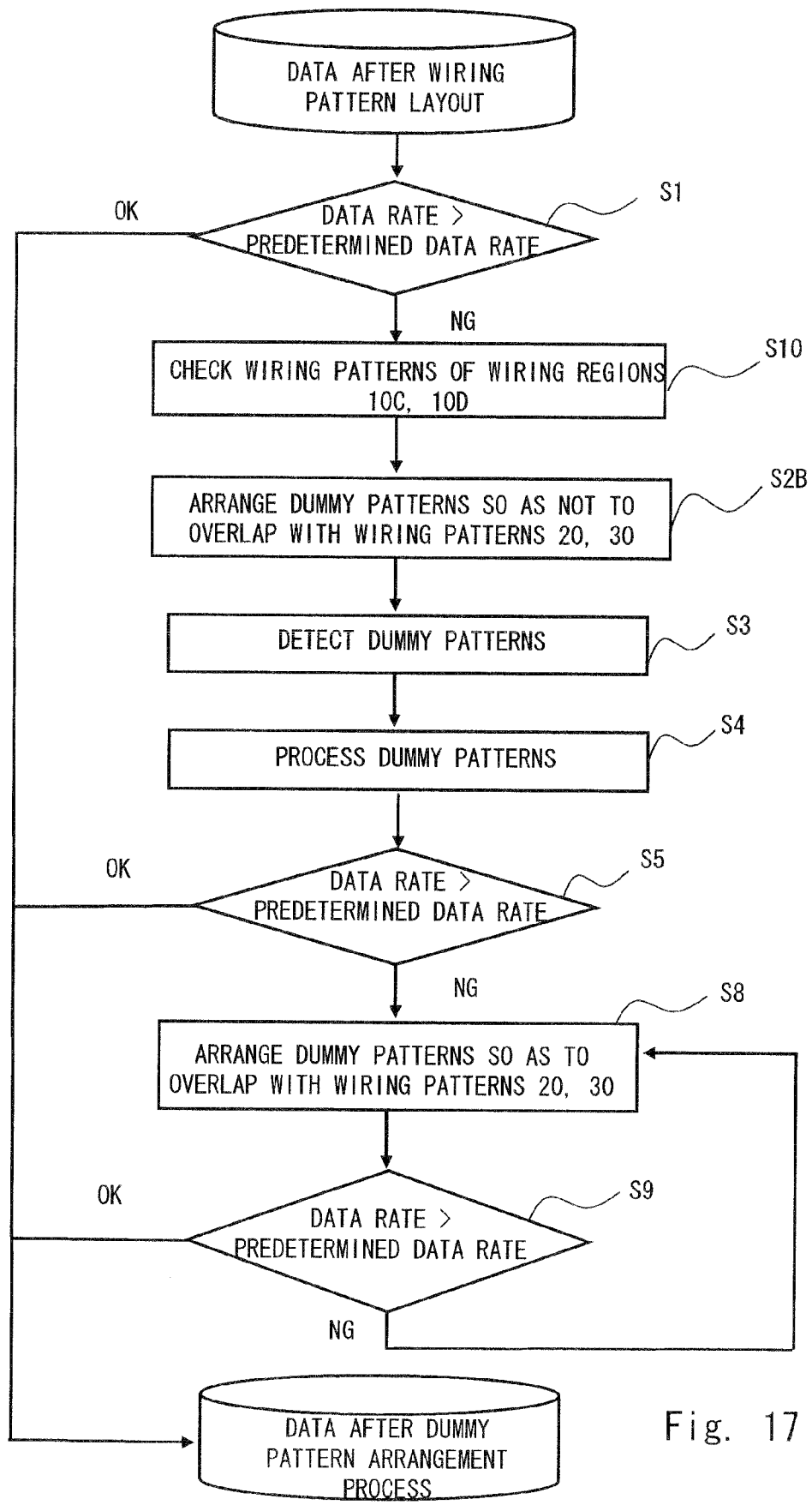
FIG. 17 is a flow chart showing a dummy pattern arrangement process according to a third embodiment.

The fourth embodiment will be described with reference to FIGS. 13 to 17. FIG. 13 shows a schematic perspective view of a semiconductor device SD2 according to the present embodiment. FIG. 14 shows a configuration diagram of the wiring region 10A (see first embodiment) superimposed on the pattern of the wiring region 10D. FIG. 15 shows a pattern of the wiring region 10D. Note that the wiring region 10D is the wiring region of the wiring layer of the lower layer of the wiring layer where the wiring region 10A is formed. FIG. 16 shows an explanation diagram of the capacity formed in laminating direction. FIG. 17 shows a flow of a dummy pattern arrangement process according to the third embodiment.

In the present embodiment, the dummy patterns are arranged in the wiring region 10A in consideration of the position of the wiring patterns arranged in the wiring region 10D of the wiring layer of the lower layer in addition to the point described in the third embodiment (arranging the dummy patterns in the wiring region 10A in consideration of the position of the wiring patterns arranged in the wiring region 10C). Therefore, the value of the capacity unintentionally added to the wiring patterns can further be made small. The further description will be made hereinafter in detail.

As shown in FIG. 13, in the present embodiment, the semiconductor device SD2 includes a wiring layer (third wiring layer) L3 in the lower layer of the wiring layer L1. Therefore, the semiconductor device SD2 has multi-layered wiring structure where the wiring layer L3, the wiring layer L2, and the wiring layer L1 are laminated in this order. The upper surface of the wiring layer L3 corresponds to the wiring region 10D described below.

The wiring layer L3, the wiring layer L1, and the wiring layer L2 are laminated in this order, and therefore the wiring region 10D, the wiring region 10A, and the wiring region 10C are laminated in this order.

FIG. 14 shows a configuration diagram where the wiring region 10A is superimposed on the patterns of the wiring region 10D. In the patterns of the wiring region 10D shown in FIG. 15, the dummy patterns 12a to 12f of the wiring region 10A are shown in dotted lines.

As shown in FIG. 14, the wiring region 10A corresponding to the upper surface of the wiring layer L1 is superimposed on the wiring region 10D corresponding to the upper surface of the wiring layer L3. As described in the third embodiment, the wiring region 10A and the wiring region 10C are superimposed with each other. Therefore, the wiring region 10C, the wiring region 10A, and the wiring region 10D are superimposed with each other in this order.

The wiring patterns 30a to 30e are formed in the wiring region 10D. The wiring patterns 30a to 30e are the patterns extending along y axis and the rectangular patterns having longitudinal direction of y axis. The wiring pattern 30a is arranged under the wiring patterns 11c and 11f. The wiring pattern 30b is arranged under the wiring patterns 11e, 11f, 11h, and 11i. The wiring pattern 30c is arranged under the wiring patterns 11b, 11e, 11f, and 11h. The wiring pattern 30d is arranged under the wiring patterns 11d, 11e, 11f, 11g, and 11j. The wiring pattern 30e is arranged under the wiring pattern 11g.

As shown in FIG. 15, the dummy patterns 12a to 12f are arranged in the wiring region 10A so as not to overlap with the wiring patterns 30a to 30e formed in the wiring region 10D. Therefore, the parasitic capacity C2 in the laminating direction can be made small as schematically shown in FIG. 16. Note that the parasitic capacity C2 is formed between the dummy land 13a of the dummy pattern 12a of the wiring region 10A and the wiring pattern 30 of the wiring region 10D. As a matter of fact, the parasitic capacity in the laminating direction formed between the dummy pattern 12a and the wiring pattern 30 is small.

As shown in FIG. 16, when the dummy pattern 12a formed in the wiring region 10A is formed immediately under the wiring pattern 30 formed in the wiring region 10D, the parasitic capacity C2 having a predetermined size is formed between the dummy pattern 12a and the wiring pattern 30. If the wiring pattern 11 and the dummy land 13a in the wiring region 10A are connected by dust in this state, the parasitic capacity C2 having a predetermined size formed between the dummy land 13a and the wiring pattern 30 is also added to the wiring patterns 11 in addition to the wiring capacity of the dummy land 13a.

In the present embodiment, the dummy pattern arrangement device 50 arranges the dummy pattern 12a in the wiring region 10A so as not to overlap with the wiring pattern 30 in consideration of the wiring pattern 30 of the wiring region 10D. Therefore, the value of the parasitic capacity formed between the dummy pattern 12a and the wiring pattern 30 can be made small (smaller than the parasitic capacity C2 formed when the dummy pattern 12a is arranged so as to overlap with the wiring pattern 30). Therefore, even when the wiring pattern 11 and the dummy land 13a are connected by dust, the parasitic capacity in the laminating direction added to the wiring pattern 11 (parasitic capacity between the dummy land 13a and the wiring pattern 30) can be set small.

In the present embodiment, as in the third embodiment, the dummy pattern arrangement device 50 arranges the dummy patterns in the wiring region 10A in consideration of the position of the wiring patterns arranged in the wiring region 10C. Therefore, the same advantage as in the third embodiment can be achieved. In other words, in the present embodiment, the dummy patterns are arranged in the wiring region that is in the intermediate position in consideration of the arrangement position of the wiring patterns arranged in the wiring regions of the upper layer and the lower layer. Therefore, the capacity added to the wiring patterns can be set lower even when the wiring patterns and the dummy patterns (dummy lands included in the dummy patterns) are connected by dust in the wiring region that is in the intermediate position.

Next, the method of arranging the dummy patterns 12a to 12f will be described with reference to a flow chart in FIG. 17.

S1 is the same as the description of the above embodiments.

When the checked data rate does not satisfy the predetermined data rate, the processing unit 52 of the dummy pattern arrangement device 50 checks the arrangement information of the wiring patterns 20a to 20e of the wiring region 10C and the wiring patterns 30a to 30e of the wiring region 10D (S10). More specifically, the arrangement position of the wiring patterns 20a to 20c in the wiring region 10C and the arrangement position of the wiring patterns 30a to 30e in the wiring region 10D are checked based on the attribute information (positional information of start points (one ends), positional information of end points (other ends), and pattern width) of the wiring patterns 20a to 20e in the wiring region 10C and the wiring patterns 30a to 30e in the wiring region 10D.

Then the pattern arrangement unit 54 of the dummy pattern arrangement device 50 arranges the dummy patterns 12a to 12f in the wiring region 10A so as not to overlap with the wiring patterns 20a to 20e of the wiring region 10C and the wiring patterns 30a to 30e of the wiring region 10D (S2B).

S3 to S9 are the same as the description made in the above embodiments.

In the present embodiment, the dummy patterns are arranged in the wiring region 10A in consideration of the position of the wiring patterns arranged in the wiring region 10C and the wiring region 10D. Therefore, the value of the capacity unintentionally added to the wiring pattern can further be smaller.

The technical scope of the present invention is not limited to the embodiments described above. The direction where the wiring patterns arranged in each wiring region extend is not necessarily fixed. The dummy patterns may be formed by five or more than five dummy lands. The wiring region may be all the area of the upper surface of the wiring layer forming the semiconductor device or may be a part of the area thereof. The specific configuration of the dummy pattern arrangement device 50 can be any. The storage 51 and the processing unit 52 can be configured with a general computer.

Note that the dummy pattern arrangement device as follows is also disclosed in this specification. The dummy pattern arrangement device arranging dummy patterns in a first region having a plurality of wiring patterns spaced apart with each other arranged therein, the device comprising a pattern detection unit obtaining positional information of wiring patterns arranged in a second region which is above or below the first region, a pattern arrangement unit arranging dummy patterns in the first region so as not to overlap with the wiring patterns of the second region identified by the pattern detection unit, and a pattern processing unit processing first ends of the dummy patterns arranged in the first region by the pattern arrangement part and arranging a first dummy land in the first wiring pattern side.

Further, the dummy pattern arrangement method as follows is also disclosed in this specification. The dummy pattern arrangement method using a computer, the method comprising reading arrangement data where a plurality of wiring patterns are arranged in a first region, checking positional information of the wiring patterns arranged in a second region above and below the first region, arranging dummy patterns in the first region so as to be spaced apart from the plurality of wiring patterns of the first region and not to overlap with the wiring patterns of the second region.

It is apparent that the present invention is not limited to the above embodiments, but may be modified and changed without departing from the scope and spirit of the invention.

What is claimed is:

1. A dummy pattern arrangement method using a computer, comprising:
   reading arrangement data where first and second wiring patterns are arranged in a first region, the first and second wiring patterns extending along a first axis line;
   arranging one or more first dummy patterns in the first region in such a manner that the first dummy pattern extends along a second axis line different from the first axis line and is separated from the first and second wiring patterns; and
   processing, by the computer, a first end of the first dummy pattern to form a first dummy land at the first wiring pattern side,
   wherein the first dummy land is formed by separating both end parts of the dummy pattern.

2. The dummy pattern arrangement method according to claim 1 further comprising:
   processing a second end of the first dummy pattern to form a second dummy land at the second wiring pattern side.

3. The dummy pattern arrangement method according to claim 1, wherein a plurality of first dummy patterns are arranged in the first region and the first ends of the plurality of first dummy patterns are processed to form the first dummy lands at the first wiring pattern side.

4. The dummy pattern arrangement method according to claim 2, wherein a plurality of first dummy patterns are arranged in the first region and the second end of the plurality of first dummy patterns are processed to form the second dummy lands at the second wiring pattern side.

5. The dummy pattern arrangement method according to claim 1, wherein width of the first dummy land along the second axis line is narrower than width of the rest of the first dummy pattern along the second axis line.

6. The dummy pattern arrangement method according to claim 1, wherein an end of the first dummy land is processed and a third dummy land is arranged next to the first dummy land.

7. The dummy pattern arrangement method according to claim 1 further comprising:
   checking arrangement position of third wiring patterns in a second region superimposed on the first region; and
   arranging the first dummy pattern in the first region so as not to overlap with the third wiring patterns.

8. The dummy pattern arrangement method according to claim 7, wherein the second region is formed in a first wiring layer immediately above or immediately below a second wiring layer where the first region is formed.

9. The dummy pattern arrangement method according to claim 1, further comprising:
   checking arrangement position of third wiring patterns in a second region superimposed on the first region;
   checking arrangement position of forth wiring patterns in a third region superimposed on the first region; and
   arranging the first dummy pattern in the first region so as not to overlap with the third wiring patterns and the forth wiring patterns.

10. The dummy pattern arrangement method according to claim 9, wherein
    the second region is formed in a second wiring layer immediately above a first wiring layer where the first region is formed, and the third region is formed in a third wiring layer immediately below the first wiring layer.

11. The dummy pattern arrangement method according to claim 7, further comprising:

checking occupation rate of patterns in the first region; and arranging one or more second dummy patterns in the first region so as to overlap with the third wiring patterns in the second region when the checked occupation rate is lower than a predetermined occupation rate, the second dummy patterns having widths narrower than widths of the third wiring patterns in the second region.

12. The dummy pattern arrangement method according to claim 1, wherein the first axis line and the second axis line are substantially perpendicular to each other.

* * * * *